US011843064B2

(12) United States Patent
Bradley et al.

(10) Patent No.: US 11,843,064 B2
(45) Date of Patent: *Dec. 12, 2023

(54) HIGH INFORMATION CONTENT IMAGING USING MIE PHOTO SENSORS

(71) Applicant: PixelEXX Systems, Inc., Westmont, IL (US)

(72) Inventors: Kenneth Forbes Bradley, Hinsdale, IL (US); Marco Nardone, Bowling Green, IL (US); Renee Kathryn Carder, Hinsdale, IL (US)

(73) Assignee: PixelEXX Systems, Inc., Hinsdale, IL (US)

( * ) Notice: Subject to any disclaimer, the term of this patent is extended or adjusted under 35 U.S.C. 154(b) by 56 days.

This patent is subject to a terminal disclaimer.

(21) Appl. No.: 17/225,994

(22) Filed: Apr. 8, 2021

(65) Prior Publication Data

US 2021/0328085 A1 Oct. 21, 2021

Related U.S. Application Data

(63) Continuation of application No. 16/629,507, filed as application No. PCT/US2019/047285 on Aug. 20, 2019, now Pat. No. 10,998,460.

(Continued)

(51) Int. Cl.
*H01L 31/0352* (2006.01)
*H01L 31/0232* (2014.01)

(52) U.S. Cl.
CPC ......... *H01L 31/035281* (2013.01); *H01L 31/02327* (2013.01)

(58) Field of Classification Search
CPC ............ H01L 31/02327; H01L 31/035281
See application file for complete search history.

(56) References Cited

U.S. PATENT DOCUMENTS

| 9,190,542 B1 | 11/2015 | Brener et al. |
| 2009/0078316 A1 | 3/2009 | Khazeni et al. |

(Continued)

FOREIGN PATENT DOCUMENTS

| CN | 107924955 A | 4/2018 |
| JP | S63-55983 A | 3/1988 |
| TW | 201230376 A | 7/2012 |

OTHER PUBLICATIONS

Cao, L., et al., "Engineering light absorption in semiconductor nanowire devices," Nature Materials, 2009, vol. 8, pp. 643-647.

(Continued)

*Primary Examiner* — Suberr L Chi
(74) *Attorney, Agent, or Firm* — Fenwick & West LLP

(57) ABSTRACT

A Mie photo sensor is described. A Mie photo sensor is configured to leverage Mie scattering to implement a photo sensor having a resonance. The resonance is based on various physical and material properties of the Mie photo sensor. In an example, a Mie photo sensor includes a layer of semiconductor material with one or more mesas. Each mesa of semiconductor material may include a scattering center. The scattering center is formed by the semiconductor material of the mesa being at least partially surround by a material with a different refractive index than the semiconductor material. The abutting refractive index materials create an interface that forms a scattering center and localizes the generation of free carriers during Mie resonance. One or more electrical contacts may be made to the mesa to measure the electrical properties of the mesa.

19 Claims, 19 Drawing Sheets

Related U.S. Application Data

(60) Provisional application No. 62/720,002, filed on Aug. 20, 2018.

(56) References Cited

U.S. PATENT DOCUMENTS

| | | |
|---|---|---|
| 2009/0273779 A1 | 11/2009 | Baumberg et al. |
| 2011/0284723 A1 | 11/2011 | Cao et al. |
| 2012/0319223 A1 | 12/2012 | Welser et al. |
| 2013/0075699 A1* | 3/2013 | Brown .................... H01L 31/08 977/773 |

OTHER PUBLICATIONS

Fan, P., et al., "Redesigning Photodetector Electrodes as an Optical Antenna," Nano Letters, 2013, vol. 13, pp. 392-396.

Kapitanova, P. et al., "Giant field enhancement in high-index dielectric subwavelength particles," Scientific Reports, vol. 7, Apr. 7, 2017, pp. 1-8.

Kreibig, U., et al., "Mie Resonances: Sensors for Physical and Chemical Cluster Interface Properties," Ber. Bunsenges. Phys. Chem., 1997, vol. 101, Issue 11, pp. 1593-1604.

Ni, Y. et al., "A 768.times.576 Logarithmic Image Sensor with Photodiode in Solar Cell mode," International Image Sensor Workshop, Jun. 2011, pp. 1-4.

PCT International Search Report & Written Opinion, International Application No. PCT/US2019/047285, dated Nov. 7, 2019, 11 Pages.

Tribelsky, M. I. et al., "Giant in-particle field concentration and Fano resonances at light scattering by high-refractive-index particles," Physical Review A, vol. 93, May 31, 2016, pp. 1-22.

United States Office Action, U.S. Appl. No. 16/629,507, dated Nov. 19, 2020, six pages.

European Patent Office, Extended European Search Report and Opinion, EP Patent Application No. 19852911.7, dated Mar. 30, 2022, 11 pages.

Fu, D. et al., "Coupled optical and electrical study of thin-film InGaAs photodetector integrated with surface InP Mie resonators," Journal of Applied Physics, vol. 119, Mar. 11, 2016, pp. 1-7.

Garín, M. et al., "All-silicon spherical-Mie-resonator photodiode with spectral response in the infrared region," Nature Communications 5(3440), Mar. 10, 2014, pp. 1-6.

Japan Patent Office, Office Action, JP Patent Application No. 2021-533375, dated Jul. 26, 2022, ten pages.

Staude, I. et al., "Metamaterial-inspired silicon nanophotonics," Nature Photonics, vol. 11, Apr. 28, 2017, pp. 274-284.

Taiwan Intellectual Property Office, Office Action, TW Patent Application 108129700, dated Aug. 16, 2022, 13 pages.

Xue, J. et al., "Constructing Mie-Scattering Porous Interface-Fused Perovskite Films to Synergistically Boost Light Harvesting and Carrier Transport," Angewandte Chemis, vol. 129, Apr. 7, 2017, pp. 5316-5320.

* cited by examiner

Resonance Plot 130

Resonance Plot 140

Resonance Plot 150

Resonance Plot 160

HIGH INFORMATION CONTENT IMAGING USING MIE PHOTO SENSORS

CROSS REFERENCE TO RELATED APPLICATIONS

This application is a continuation of U.S. patent application Ser. No. 16/629,507 filed on Jan. 8, 2020, which is a 371 National Stage entry of Patent Cooperation Treaty Application Number PCT/US2019/047285 filed Aug. 20, 2019, which claims benefit to U.S. Provisional application No. 62/720,002 filed on Aug. 20, 2018, all of which are incorporated herein in their entirety by this reference.

GOVERNMENT RIGHTS LEGEND

This invention was made with government support under Federal Award Identification Number 1660145 awarded by the National Science Foundation. The government has certain rights in the invention.

BACKGROUND

1. Technical Field

This disclosure relates generally to a photo-sensitive device, and more particularly, to an array of photo-sensitive devices for generating images.

2. Description of the Related Art

Conventional photo sensors operate at size scales where sensor elements that interact with incident light are much larger than the light's wavelength. For example, conventional photo sensors are on the order of a micron in size to sense light at visible wavelengths. At these sizes, Snell's law of refraction holds, and the absorption of incident light on a photo sensor follows the Beer-Lambert law. Many attempts at designing photo sensor to minimize their physical size, but the resulting sensors often have many drawbacks. For example, the signal-to-noise ratio, dynamic range, depth of field, and depth of focus, all deteriorate when generating images with photo sensors of decreased size. Accordingly, a photo sensor with decreased size that is able generate high quality images would be beneficial.

SUMMARY

A Mie photo sensor is described. A Mie photo sensor leverages Mie scattering to generate improved photo currents relative to conventional photo sensor technologies as described herein. A Mie photo sensor comprises a substrate of a material (i.e., a material layer) such as a semiconductor or an insulator. The material layer has a first index of refraction and comprises a mesa of semiconducting material. The mesa is configured to generate free carriers within the semiconducting material in response to an electromagnetic perturbation (e.g., incident light, x-rays, etc.).

The Mie photo sensor also comprise a refractive medium surrounding the material layer. The refractive medium may have a complex index of refraction. The refractive medium abuts the mesa and forms an interface with an index of refraction across the interface that is discontinuous. Additionally, the refractive medium defines an electromagnetic scattering center (e.g., the mesa, or some portion of the mesa) configured for generating free carriers via optical absorption and Mie resonance of the electromagnetic perturbation at the scattering center.

In an example embodiment, the refractive profiles of the Mie photo sensors are described as follows: the material layer has a first index of refraction, the mesa of semiconducting material has a second index of refraction, and the refractive medium has a third index of refraction. The index of refraction for the refractive medium is generally complex and may be discontinuous across the boundary between the mesa and the refractive material. In an example, the third index of refraction is less than the first index of refraction and the second index of refraction. In another example, the first index of refraction is the same as the second index of refraction.

In an example embodiment, the mesa of semiconductor layer forms a geometric shape (e.g., a rectangular prism, a cube, etc.) having a set of boundaries which abut the refractive medium. As such, the electromagnetic scattering center is formed either at the boundaries of the shape, or within the boundaries of the shape, such that the electromagnetic scattering center comprises some portion (or all) of semiconducting material of the mesa.

In an example embodiment, the material layer comprises silicon and the mesa comprises doped silicon. In another example embodiment, the material layer comprises silicon dioxide and the mesa comprises silicon. Other example embodiments are also possible.

Various physical characteristics of the scattering center influence which electromagnetic perturbations are absorbed by the material of the scattering center and, thereby, generate free carriers. For example, the dimensions of the mesa may affect the wavelength and polarization of electromagnetic perturbations that may be absorbed by the scattering center.

The Mie photo sensor also comprises one or more electrical contacts coupled to the mesa and configured to sense free carriers generated within the scattering center in response to the electromagnetic perturbation. There are several example configurations of contacts possible. In a first example, a first contact of the electrical contacts forms an Ohmic contact with the mesa and a second contact forms a Schottky barrier with the mesa. In a second example, a first contact forms an Ohmic contact with the mesa and a second contact forms a p-n junction with the mesa. In a third example, a first contact and a second contact form an Ohmic contact with the mesa of semiconductor material. In this case, the Mie photo sensor includes a p-n junction at a boundary between the refractive material and the mesa of semiconducting material.

The Mie photo sensor operates in a resonance fashion, where the resonance is based on any of the factors described herein. For example, the electromagnetic scattering center absorbs a particular wavelength of electromagnetic perturbation at a resonance level and generates a first amount of free carriers corresponding the resonance level. Additionally, the electromagnetic scattering center absorbs a different wavelength of electromagnetic perturbation at a non-resonance level and generates a second amount of free carriers corresponding to the non-resonance level. In this situation, the first amount of free electrons is greater than the second amount of free electrons.

Further, a Mie photo sensor is configured to localize carrier generation in a scattering center as described herein. That is, the absorption of the electromagnetic perturbation in the electromagnetic scattering center is higher than the absorption of the electromagnetic perturbation in both the semiconductor layer and the refractive medium. For example, a first amount of free carriers generated by the absorption of the electromagnetic perturbation in the electromagnetic scattering center is greater than a second amount of carriers are generated by the electromagnetic perturbation in the semiconductor layers.

Additionally, the Mie photo sensors can be connected to various control electronics to create a pixel. Multiple pixels may be connected to one another to form an image sensor. For various reasons described herein, an image sensor including pixels created with Mie photo sensors operates better than their conventional counterparts.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

Figure 1A:
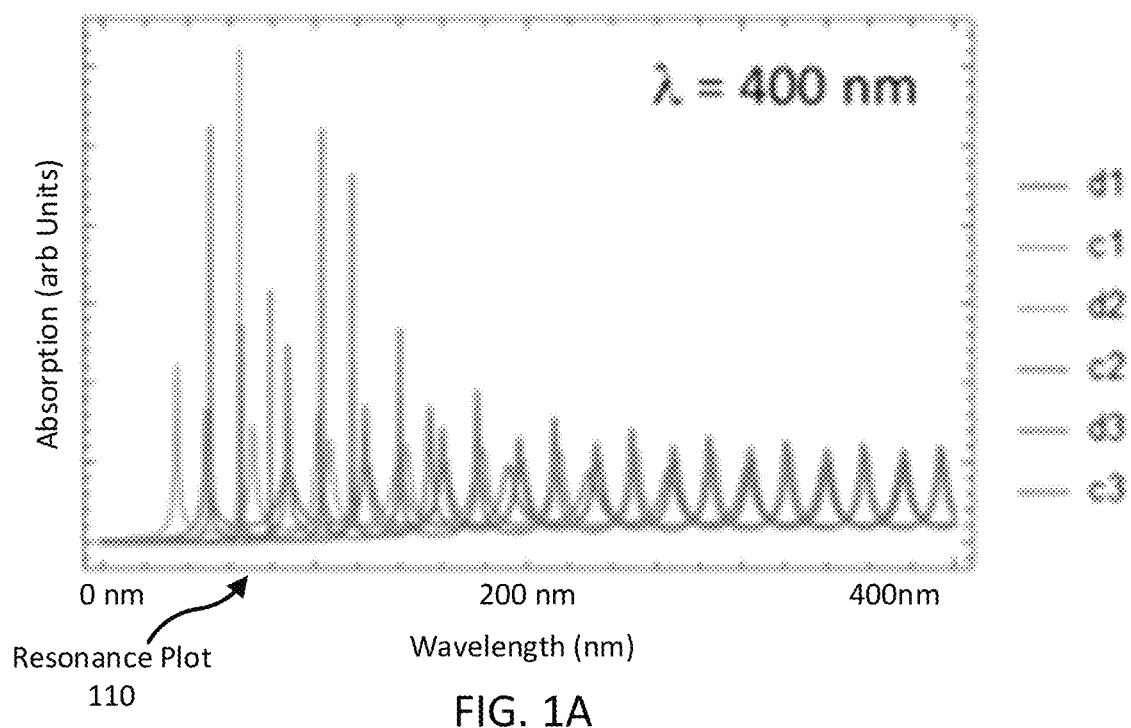
FIGS. 1A-1H illustrate a series of resonance plots, according to several example embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

I. Introduction

Photo sensor arrays are composed of a surface including a number of pixels where each pixel may comprise a photo sensor and signal collection electronics that are, generally, approximately co-located with each photo sensor. Each pixel operates by detecting photons at particular wavelengths and then generating an electrical charge, voltage, or resistance that is related to the number of photons detected at each pixel. This charge, voltage, or resistance is then measured, digitized, and used to construct an image of the object, scene, or phenomenon that emitted or reflected the photons. Photo sensors can also be deployed for imaging as single detector or as an array of detectors.

Future photo sensor technology adoption may be fueled by, for example, three primary ideas: i) image quality (e.g., resolution, low light performance, multispectral imaging, etc.), ii) pixel size in three-dimensions, and, 3) device functionality (e.g., high-speed video, image analysis, motion control, cost, Size, Weight, and Power (SWaP), etc.). Innovation in each of these areas includes design decisions at every level. Example design decisions may include, for example, the structure and device physics of the photo sensing element (i.e., photon detection), the basic operation of the pixel (i.e., signal capture, storage, and transfer) and the design and operation of the imaging array (i.e., image readout and signal processing).

At each of these levels, significant challenges remain for improving performance. For example, the challenges may include improving performance tradeoffs between a set of devices, device processes, and a circuit (or circuits) made of those devices. Furthermore, the challenges are becoming more apparent as image processing moves into a new era where design emphasis goes beyond image data to information-centric image sensors (e.g., computational image sensors, silicon retinas embedded in smart vision systems, etc.). Market drivers for image sensors are pushing for embedded computer vision pre-processing functions, improved response times and minimized SWaP for a large set of vision systems that include wireless sensor networks, unattended surveillance networks, automotive, internet-of-things and other portable vision applications.

II. Current Photo Sensor Technologies, Optimizations and Tradeoffs

II.A The Structure and Device Physics of Photo Sensors

For imaging visible light, the underlying photo-sensing process begins with light absorption in a semiconductor. The process is, generally, similar for imaging in the x-ray, ultraviolet, and infrared portions of the spectrum. The absorbed light generates an electron-hole pair and the constituent electron and hole are separated in space by an electric field in a depletion region in the semiconductor. Depletion regions can be formed by varying properties in a semiconductor system (e.g., a semiconductor junction) or using a semiconductor-metal junction (e.g., a Schottky junction).

Conventional photo sensors operate in the realm of physical optics where individual sensor elements that interact with incident light are much larger than the light's wavelength. In this regime, Snell's law of refraction holds, the absorption of radiation follows the Beer-Lambert law, and scattering is proportional to the projected physical area of the scattering element. For photo detectors in this regime to act as an effective light absorber, the semiconductor that comprises the photo sensor must be optically thick. That is, the probability that a photon is absorbed in a layer of semiconductor is $$1-e^{-\alpha d} \tag{1}$$

where $\alpha$ is an absorption coefficient that depends on both the incident light's wavelength and the absorbing material's composition, and d is the layer thickness along the direction of incident light. A useful estimate for a minimum layer thickness is $\alpha^{-1}$, at which around 60% of the incident light is absorbed in the photo sensor.

Silicon is a versatile and economically viable semiconductor material for visible light photo sensors. Across the visible spectrum the absorption coefficient of silicon varies from about $10^5$ cm$^{-1}$ at 390 nm to about $10^3$ cm$^{-1}$ at 700 nm. For silicon, the absorption coefficients indicate that a semiconductor thickness should be about 1 µm to absorb around 60% of the incident light.

A semiconductor thickness of around 1 µm introduces several problems for improving image sensors (e.g., size, response, etc.). One problem stems from commercially feasible semiconductor fabrication processes rely on photolithography. Photolithography is best for planer or pseudoplaner structures. For example, approximately planer structures (e.g., photo sensors) with planer features on the order of, or larger than, vertical features (i.e., out of the plane). As a result, because the vertical dimension for good absorption for a silicon is approximately 1 µm, planer photo sensor dimensions are also, generally, on the order of 1 µm. Therefore, while the dimension in the plane can be reduced somewhat, photo sensor sizes are difficult to substantially reduce below 1 µm. Another problem stemming from thick sensors is that thick sensors limit the possibility of using vertical layers of stacked arrays. For example, having a stack of three sensor arrays, each with a thickness of 1 µm yields a stack height of 3 µm. In this case, absorption of light in one or more of the layers may be reduced because of the thickness of the stack. However, if stacked arrays substantially thinner than 1 µm could be implemented, various benefits could be seen. For example, a stack of think layers would allow the layers to deconvolve chromic aberrations in associated imaging optics.

Photo sensors may also use other materials with higher absorption coefficients. As an example, in the visible spectrum, gallium arsenide's absorption coefficient ranges from about $10^5$ to $10^6$ cm$^{-1}$. This suggests that a 0.1 µm thick semiconductor will deliver a 1/e absorption probability. However, there are still several drawbacks to gallium arsenide. For example, gallium arsenide is the second most common semiconductor utilized by the semiconductor industry and is, generally, much more expensive than silicon. In addition, fabrication of gallium arsenide features at length scales significantly less than 1 µm is very challenging and commercial implementation is uncommon. Finally, creating ohmic contacts to gallium arsenide (for electrical connections) with dimensions significantly smaller than 1 µm is difficult and has exhibited unacceptably low yields.

One way to improve the imaging performance of photosensitive arrays is to make large pixels while, at the same time, keeping the overall pixel count constant. Cameras used in some scientific applications have pixels with linear dimensions of 15 µm or more. These large pixel sizes enable an improvement in dynamic range and noise. However, larger pixel sizes are counter to current market drivers and come at the cost of both camera size and expense. To maintain similar imaging properties for a camera using a sensor array comprised of 1 µm pixels, a detector with 15 µm pixels has an area approximately 200 times larger, and the imaging optics volume is approximately 3000 times larger. Both of these implications (e.g., size and volume) severely limit the extent to which such a solution for improving photo sensors can be utilized. For example, in practice, implementing significantly larger pixels is often accompanied by a decrease in pixel count, a decrease in maximum field-of-view, or both.

Another method to improve photo sensor performance is to increase photo sensor light sensitivity (e.g., low light intensity measurements) by utilizing avalanche effects in the photo sensor. That is, applied voltages are used to generate high electric fields in the semiconductor and increased light sensitivities occur in response. The high fields accelerate photo-generated carriers to significantly higher velocities than would be attained otherwise. Subsequent collisions create additional free carriers which are accelerated in turn. As a result, single incident photons can generate a substantial output signal. While such photo sensors can achieve very high sensitivity, they are often operated in Geiger mode which yields a dynamic range of 0 dB. Otherwise, such devices are operated in proportional mode which can deliver a dynamic range of up to 60 dB, but only for an incident intensity range of about 1 to 1000 photons/measurement interval.

Plasmonic materials have also been explored as a method for amplifying the light incident on the photo sensor. In this case the photo sensor produces surface excitations of electrons enabling conductors to strongly absorb, and subsequently re-radiate, the incident light. Plasmonics utilizes strong resonances that can be tailored to preferentially interact with specific combinations of incident wavelength and polarization. To date, plasmonics have failed to enable enhanced photo sensing capabilities and plasmonic photo sensors experience large dissipative losses.

Additionally, although plasmonic sensors have large losses dissipative losses, plasmonic systems have been developed that contribute to concentrating incident light in regions adjacent to the system supporting the plasmonic excitations. As an example, conduction metallic sheets with subwavelength size partial- or through-holes have been shown to concentrate light within the holes. Mie Photo Sensors, encased in a layer of low-index of refraction insulating material (such silicon dioxide) could be combined with such plasmonic systems for enhanced detection. In addition, it should be noted that other metallic systems that have one or more dimensional parameter at or below the wavelength of incident light, and that are adjacent to the Mie Photo Sensor can have a similar effect. As an example, this can be achieved by adjusting the shape, size, or spacing of the metallic contacts on the Mie Photo Sensor.

Improving image quality and shrinking pixel size may drive future photo sensor technology adoption. However, a number of these drivers are fraught with tradeoffs between limiters that have negative effects on optical and electrical performance. For instance, reducing pixel pitch (the center-to-center spacing of pixels, p) can affect the scaling factor for several metrics driving photo sensor development as shown in Table 1.

TABLE 1

| | |
|---|---|
| Signal-to-noise | $\sim p^{-1}$ |
| Dynamic range | $\sim p^{-2}$ |
| Depth of field | $\sim p^{-1}$ |
| Depth of focus | $\sim p^{-1}$ |

Although there are strong market drivers for reducing pixel size, as these parameters dependencies show, such a reduction can reduce performance in other areas.

Generally, improvement in overall image sensor performance from small pixels has focused on increasing signal and decreasing noise. Much of the optimization has been done with improvements in pixel design and processing technology at the array level.

II.B. Basic Operation of a Pixel

A pixel is comprised of an individual photo sensor and the signal collection electronics for operating and reading the photo sensor. Generally, signal collection electronics are co-located with each photo sensor. The signal generated from light absorbed by a semiconductor can be acquired from a measurement of the quantity of charge carriers created (a charge-collection, or short-circuit mode) or it can be acquired from a measurement of the voltage across the depletion region (a voltage, or open-circuit voltage mode). In the first case, the generated signal is proportional to the incident light intensity, and, in the second case, the generated signal is proportional to the logarithm of the incident light intensity.

Generally, photo sensors in imaging systems operate in the charge-collection mode. Operating in charge-collection mode allows the photo sensor's linear response to incident light to ease data handling for image processing and, further, allows photo sensors to be more sensitive to low incident light intensities. In charge-collection mode, charge generated in the photo sensor is collected during a fixed integration time window and an electrical signal that is proportional to the total charge accumulated during that window is the reported measurement. As previously described, the charge a photo sensor can collect is proportional to the area of the sensor. As such, as the photo sensor area decreases, the upper end of the sensor's dynamic range falls in proportion to the square of the pixel's linear size. To counteract this effect, the integration time can be reduced as the square of pixel size. Such a time reduction reduces low-light sensitivity and increases the complexity and power requirements of both the sensor and the associated electronics. In addition, as charge-collection mode photo sensors shrink, their internal leakage current increases as a proportion of the saturation current. This leakage current acts as a noise source and, notably, noise sources place a floor on the lower end of the sensor's dynamic range. Together, these two effects limit the total dynamic range which, in turn, translates into limits on the scene contrast that can be captured by the imaging system. Current imaging systems generally exhibit dynamic ranges of between 60 and 70 dB indicating they capture variations of about 3½ decades in light intensity.

Photo sensors in imaging systems can use other means to generate improved signals from light absorbed by a photo sensor. For example, the active pixel concept, the pinned photodiode pixel, and correlated double sampling methods have been used to improve light sensitivity and reduce noise in the charge-collection mode. However, despite efforts to increase light sensitivity, dark current remains a salient factor for small pixels in applications which require long integration time and low illumination. Additionally, even if technological breakthroughs enable further reduction in noise sources signal-to-noise ratios, will, generally, continue to worsen as pixel sizes are reduced to dimensions below 1 micron.

Fill factor (i.e., the percentage of light sensitive area in a pixel) directly impacts the sensitivity of a sensor and the signal-to-noise of the captured image. There is an inverse relationship between the number of transistors in a given pixel and its fill factor. In one example, an active pixel with a pinned photodiode is characterized by 4 transistors and 5 interconnections in each pixel, resulting in a relatively low fill factor where the in-pixel circuitry consumes a large amount of space relative to the photo sensing area. Low fill factors can be mitigated by sharing some of the control circuitry between multiple pixels, however, this usually means that only the sum of the shared pixels' signal is accessible.

One method to shrink pixel size and solve the full well capacity problem is to create photo sensors smaller than 1 µm that can only measure the presence or absence of one, or at most several, photons, but, on the other hand, can be operated at very high speed. At high speeds, the measurement time is reduced such that the sensors are unlikely to saturate. The signal generated by the sensors is then composed of the sum of charge collected over many time windows rather than that collected during a single time window a. A major drawback of this technique is that operating a large number of photo sensors at high data acquisition rates requires a large amount of power which adds to the operating costs, and, creates heat which can be difficult to dissipate.

A different approach to increase the dynamic range of image sensor arrays has been to operate them in open-circuit voltage mode. Open-circuit voltage mode delivers a logarithmic response, (i.e., similar to an eye or of film), instead of the linear response in charge-collection mode. Arrays using open-circuit voltage mode have demonstrated a dynamic range of over 120 dB, a range of measurable light intensity spanning six orders of magnitude and approximately twice what's achieved in most current detector arrays. However, arrays using open-circuit voltage mode have performed poorly at lower light intensities where their response is dominated by noise.

Another drawback of open-circuit mode photo sensors is that, for pixels larger than 1 µm, the time constant of silicon semiconductor junctions' voltage-response to light is slow compared to the frame-to-frame transition time. As a result, extra circuitry must be included to forcibly reset each photo sensor before the start of image acquisition. In addition, for pixels larger than 1 µm, the voltage-response time is frequently longer than the exposure time. This means such pixels operated in voltage mode do not reach equilibrium during the exposure. Such dynamic measurements have additional sources of both random noise as well as difficult to eliminate systematic errors.

II.C Design and Operation of the Imaging Array

Individual photo sensors and pixels can be used as single detectors, or as linear and two-dimensional arrays of detectors. Pixel-to-pixel spacing determines two important parameters in a photo sensor array: the imaging system's spatial resolution in image space and the size of the imaging array for a given number of pixels. The pixel-to-pixel spacing can place an upper limit on the spatial frequency that can be captured in the image. This pixel-to-pixel spacing corresponds to a similar spatial-resolution metric in object space. Although, the specific limit depends on the imaging optics, pixel-to-pixel spacing limits the spatial detail that can be discerned in the object. Furthermore, as pixel-to-pixel spacing increases, the area of the sensor array increases by the square of this spacing. Semiconductor device costs rise proportionately to device area, so increases in pixel-to-pixel spacing has an important impact on imaging array costs.

Many improvements in array design have been driven by the need for smaller pixels. Optimization of pixels falls into two major categories: (i) improving light sensitivity, and (ii) reducing noise. Light-gathering improvements include micro-lenses, light guides, anti-reflective coatings, thinning interconnect layers and dielectrics, backside illumination, and three-dimensional integration of integrated circuits or stacked structures to separate photon detection from pixel readout and signal processing. Many of these same improvements also reduce optical cross-talk. Deep trench isolation and buried color filters also reduce optical crosstalk and improve the module transfer function.

Stacked structures in photo sensors can be used to increase the information density on the captured image.

Multiple frequencies can be simultaneously detected at each imaging point without the need for areal filtering. Areal filtering removes all but the light of a particular sort "upstream" (i.e., higher in the stacked structure) from a photo-sensor. Thus, areal filtering removes all other light from the incoming signal. Conversely, stacked photo sensors enable vertical filtering of color. In this case, color separation arises because the different light wavelengths have different absorption coefficients; however, the different color sensing layers have large contributions from all visible wavelengths. Variable color sensing between layers contributes to difficulty in resolving color accurately. Implementing stacked structures also has additional information processing challenges. Because certain wavelengths of light are absorbed to varying degrees in all layers, producing a standard Red-Green-Blue image is challenging. In particular, all the different color contributions from each of the layers of the stacked structure are deconvolved before forming an image.

In summary, many of the trade-offs in choosing the most suitable camera for a specific vision application stem from the physics of operation of the devices today. Fundamental competing factors define the performance and they force complex tradeoffs in device, process and circuitry. Limitations on minimum pixel size, sensor dynamic range, and the photo sensor's noise characteristics all contribute to generally lower performance than is desirable—and, even lower than that achieved using film.

III Mie Photo Sensors

Mie scattering allows small dimensional structures to have optical cross sections larger than their physical cross-sections. As such, Mie scattering may enable improvement to photo sensor performance by increasing light sensitivity, by, for example, concentrating the amount of light available to the photo sensor based on the sensor's optical cross-section. For example, in Mie scattering, objects with length scales on the order of the incident light's wavelength exhibit complex scattering properties that can preferentially direct light toward a photo sensor. Mie scattering enables a resonance that can be tailored to preferentially interact with specific combinations of incident wavelength and polarization. Therefore, devices utilizing Mie scattering can be used to increase the capabilities of a photo sensor. Further, the configuration, design, and characteristics of the structure enabling Mie scattering (e.g., structure geometry, structure material(s), and spatial relationship of features within the structure) can be selected to increase the capabilities of a photo sensor. Mie scattering is described in more detail in Section III.A.

Herein, any photo sensor utilizing Mie scattering is described as a Mie photo sensor. A Mie photo sensor enhances photo sensor capability by measuring light concentrated internally to a scattering center of the photo sensor. A scattering center is an area of a Mie photo sensor that leverages Mie scattering to increase current generation. In an example, a Mie photo sensor includes a scattering center that enhances photon detection. That is, a signal generated by a Mie photo sensor in response to a photon incident on a scattering center is higher than in conventional photo sensors because of the Mie scattering effect. The generated signal may be subsequently detected in one or more additional sensors (e.g., as a current, voltage, or resistance).

III.A Mie Scattering

Mie scattering can be described, generally, as a description of the optical scattering problem that is a general solution to Maxwell's equations for light scattering from an object. In general, as an object becomes much larger than the wavelength of light, the solutions to Maxwell's equations converge with those provided by a physical optics solution (i.e., as discussed in previous sections). Additionally, as an object becomes much smaller than the wavelength of light, solutions to Maxwell's equations converge with the Rayleigh scattering approximation. However, in the intermediate region, the scattering solution becomes more complex and is known as Mie scattering.

For example, light of a given wavelength, $\lambda$, will exhibit Mie scattering from an object when that object has a characteristic size in the range of about $\frac{1}{5}\cdot\lambda$ to about $10\cdot\lambda$. For a sphere of radius r, the characteristic size is the sphere's circumference, $2\pi r$; for an oblate spheroid it is $2\pi a$ where a is the spheroid's major axis; and for an infinitely long cylinder of radius r, it $2\pi r$. Finite cylinders of length 2.5r and longer behave similarly to infinite cylinders. Thus, for visible light, spherical particles with radii between approximately 20 nm and 1.1 μm will exhibit Mie scattering. The aforementioned shapes are convenient examples because they have analytical solutions to the optical scattering problem in this size regime but could be any other shape. For arbitrary volumes, such as various polyhedrons, only numerical solutions are available.

A Mie photo sensor can generate signals for image sensing by creating large in-particle fields. Large in-particle fields are possible when the scattering object is large compared to the ratio of the incident light's wavelength to the real part of the index of refraction of the object's constituent material (i.e., the object is optically large), small compared to the wavelength of the incident light (i.e., the object is geometrically small), and the scattering object has small attenuation coefficient compared to 1.

Mie photo sensors are constructed to increase the generation of internal regions of high electric and magnetic fields resulting from the scattering of the incident light. Such fields drive an enhanced absorption probability and, therefore, an increased photocurrent leading to improved image generation characteristics. Because such regions of concentrated fields are possible in structures thinner than an absorption thickness, the thickness requirement of conventional photo sensors does not apply to Mie photo sensors. Take, for example, a Mie photo sensor whose scattering center is a silicon sphere of radius 100 nm for which the characteristic size is $2\pi r$ or 628 nm. In this example, 600 nm light is incident on the scattering center. For silicon, the real index of refraction at 600 nm is 3.939 and the attenuation coefficient is 0.02 leading to an absorption length of $4.14\times10^3$ $cm^{-1}$. Thus, the characteristic length of such a sphere is over 4 times larger than the ratio of the incident wavelength to its index of refraction. At the same time, the sphere's attenuation coefficient at its thickest is 0.083. This example illustrates one difference between Mie photo sensors and conventional photo sensors. For example, conventional photo sensors are implemented so as to maximize their light absorption probability by being as thick as possible with a roughly minimum thickness of 1 absorption length of the incident light to be measured.

In Mie photo sensors generating large in-particle fields, both the scattered and the absorbed components of the incident energy are small, and the remaining energy is concentrated internally to the scattering object. Interference effects can cancel out incident energy in the regions near the scattering object resulting in the object's optical cross section significantly exceeding its physical cross section. That is, effectively, a Mie photo sensor acts as if it absorbs light from a structure much larger than what it actually is.

Mie photo sensors can include scattering centers composed of dielectric materials having a real part of their refractive index (the index of refraction) that is strongly mismatched with the surroundings and for which the imaginary part of the refractive index (the attenuation coefficient) is small. That is, materials for a Mie photo sensor may have a refractive index:

$$\hat{m} = m + i\kappa \quad (2)$$

such that $$m > 1 \ \& \ \kappa \ll 1 \quad (3)$$

Examples of such materials include many semiconductors: for example, silicon (m=4.14, κ=0.01), gallium arsenide (m=4.13, κ=0.34), and gallium phosphide (m=3.49, =0.003). When semiconductor materials, for example, form objects having sizes suitable for Mie scattering and surrounded by low index of refraction materials, they can experience extraordinarily large internal electric and magnetic fields in response to incident light as a necessary consequence of their generation of far-field Mie scattering patterns. Some low index of refraction materials for semiconductors can be, for instance, air (m=1), silicon dioxide (m=1.5), oil, or water. In the case of semiconductor scattering centers, the large energy densities formed by these internal fields drive large free carrier creation. The number of the optically generated free carriers in a Mie photo sensor is, generally, proportional to the incident light's intensity and can be used in either the charge-collection mode or in open-circuit voltage mode to drive an output signal that reports the incident light intensity.

Resonances in Mie photo detectors are excitations in response to a specific, often narrow, range of variables such as, for example, wavelength. As a result, the size of the scattering object can be tailored to enhance the sensor's response to a particular wavelength range without filtering out other wavelengths. Particular wavelength response provides the opportunity to create photo sensors that inherently respond to desired wavelengths. Multiple adjacent sensors can be employed to provide wavelength specificity (either color sensitivity or multi-spectral imaging). In some cases, a broad wavelength response is desired over a specific narrow wavelength response. Fortunately, in this case, the resonances can occur in overlapping cascades that enable a broad wavelength response. In general, changing the shape of individual conventional photo sensors does not serve as a means of wavelength or polarization selection. Thus, selecting appropriate shapes, sizes, depths, etc. in Mie photo sensors can be select wavelengths or polarizations for absorption by the photo sensors.

Resonance overlap can be seen in an example solution to Mie scattering using a spherical scattering center. To begin, a Mie solution to the optical scattering problem expands the electromagnetic field in terms of an infinite series of orthonormal functions so as to satisfy the appropriate boundary conditions at the scattering object's (e.g., a sphere, a polyhedron, etc.) surface. That is, the individual electric and magnetic fields' radial components are 0 and their tangential components are continuous. In the idealized case of a sphere, the orthonormal basis functions are constructed from complex linear combinations of the Riccati-Bessel functions; these new functions are designated $\psi_n$ and $\xi_n$ where n designates the order of the underlying Riccati-Bessel functions and the solution is fully determined by a series of 4 coefficients for each term in the expansion. Two of those coefficients relate only to the electric and magnetic fields exterior to the scattering object; the remaining two each indicate the intensity of the electric and magnetic fields respectively inside the scattering object. These coefficients depend on a dimensionless size parameter describing the relationship between the scattering object's physical size and the light's wavelength:

$$x = \frac{2\pi r}{\lambda};$$

the scattering object's complex index of refraction, m; and, the order of the expansion: n. In the limit of κ=0, the solution internal to the scattering sphere is given by:

$$c_n = \frac{-im}{m\psi'_n(mx)\xi_n(mx) - \xi'_n(mx)\psi_n(mx)} \quad (4)$$

where $c_n$ is the coefficient describing the intensity of the electric field; and, $$d_n = \frac{im}{m\xi'_n(mx)\psi_n(mx) - \psi'_n(mx)\xi_n(mx)} \quad (5)$$

where $d_n$ is the coefficient describing the intensity of the magnetic field; and where ' (or "prime") indicates the derivative with respect to the whole argument. Lower orders of n (the dipole, quadrupole and octupole terms: n=1, 2, and 3) generally have the largest impact because the lower order orthonormal functions dominate the series expansion and each term is subsequently multiplied by an additional factor proportional to 1/n in calculating that term's contribution to the total field. The coefficients as a function of sphere radius can be plotted to visualize the realms where the resonances overlap.

Figure 1B:
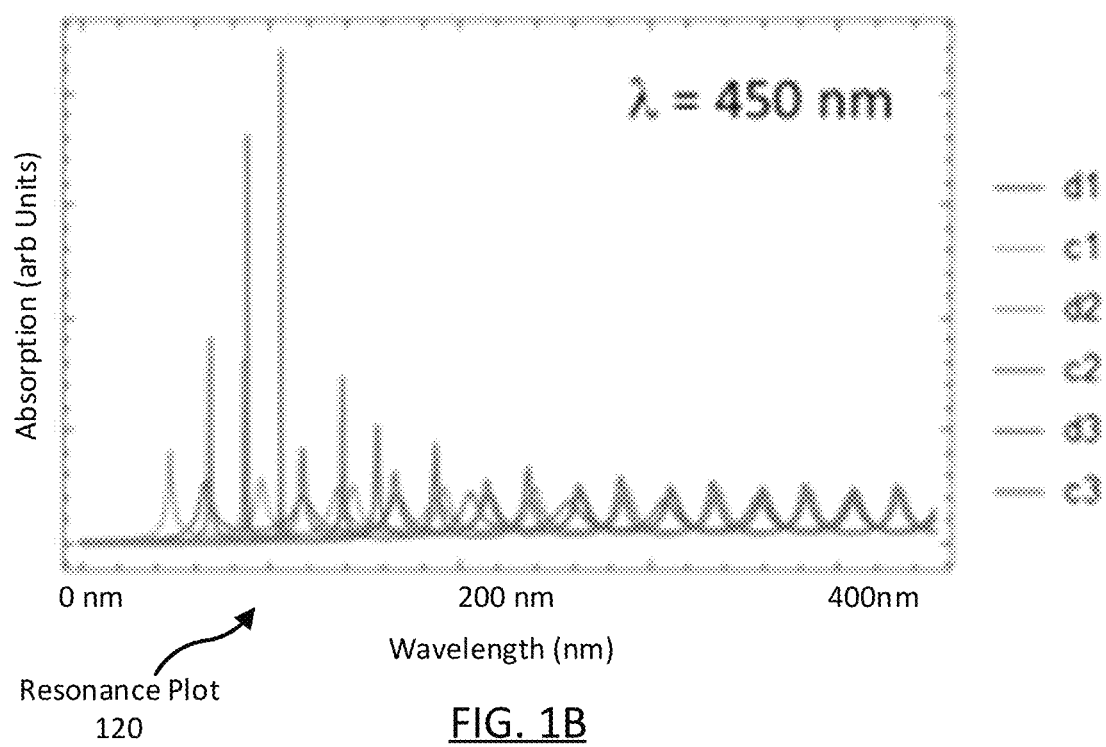
Figure 1C:
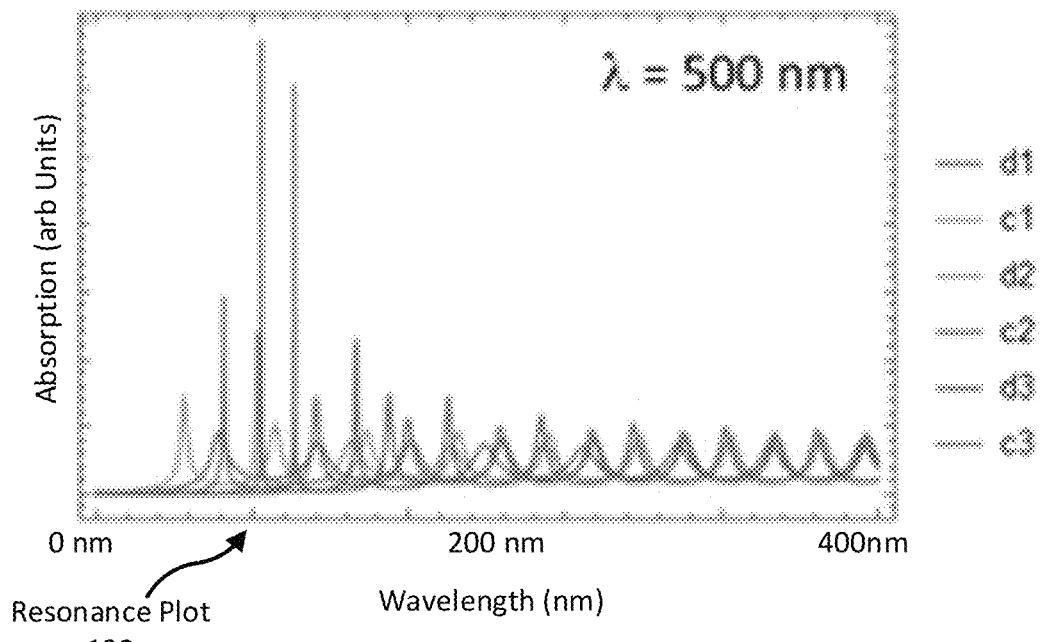
Figure 1D:
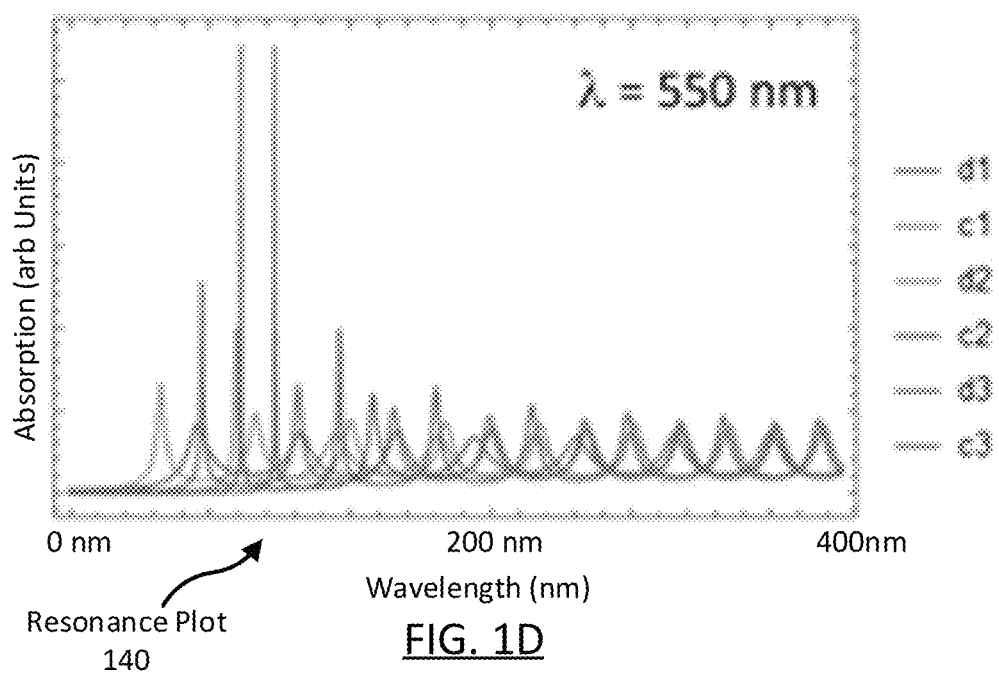
Figure 1E:
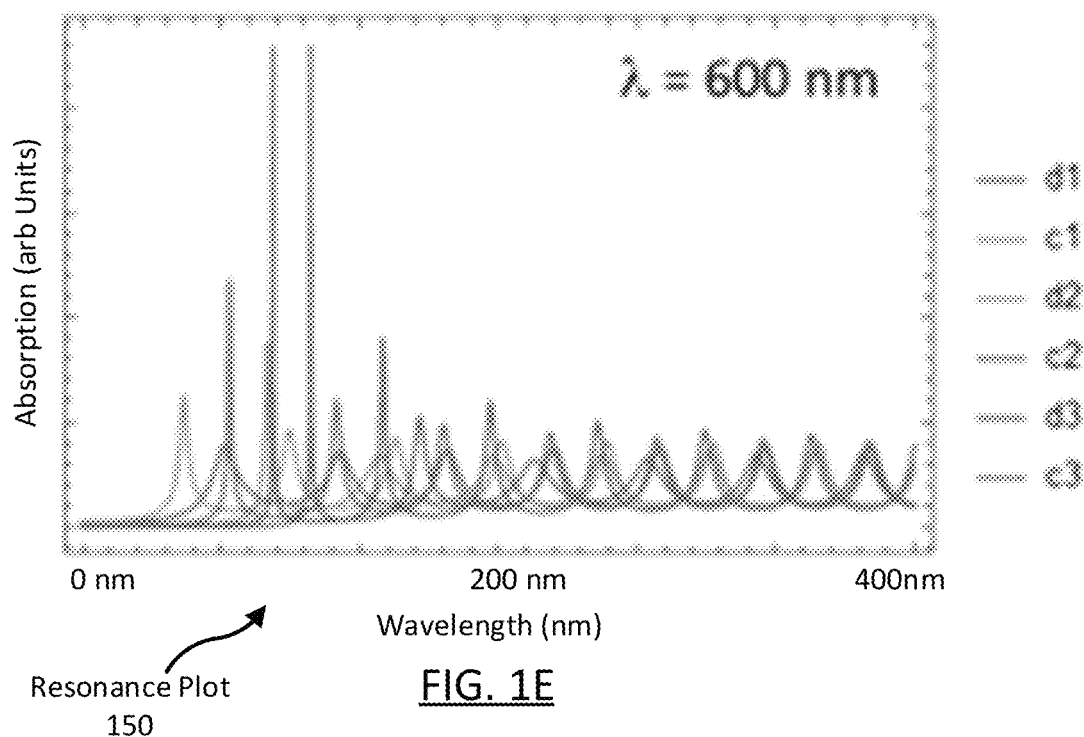
Figure 1F:
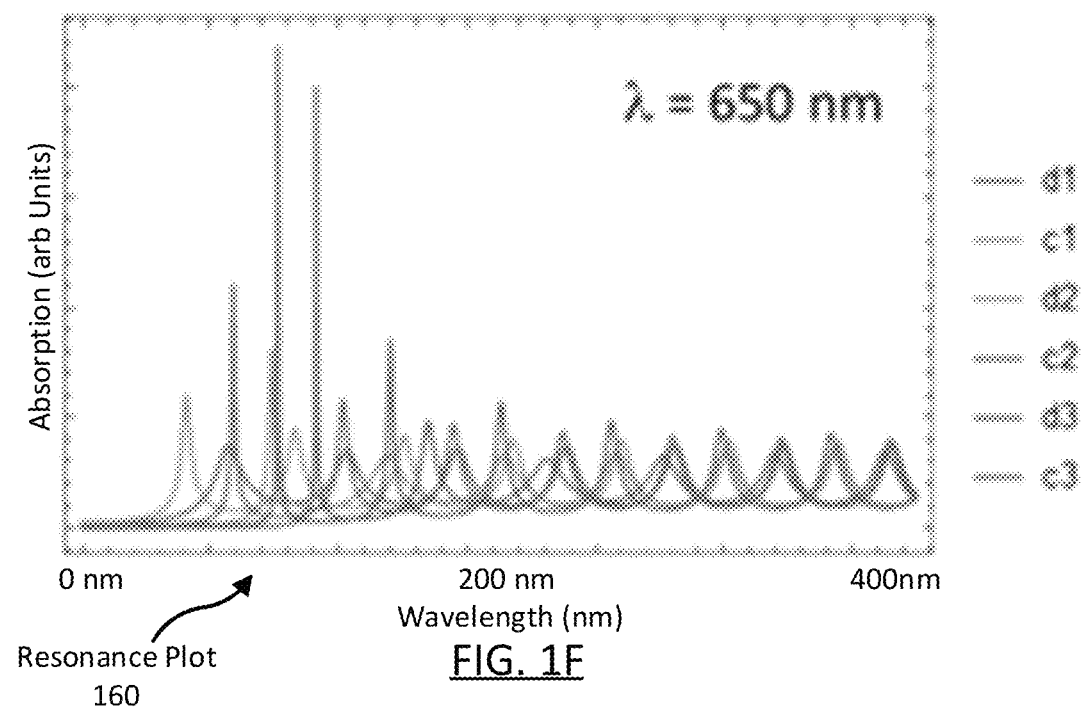
Figure 1G:
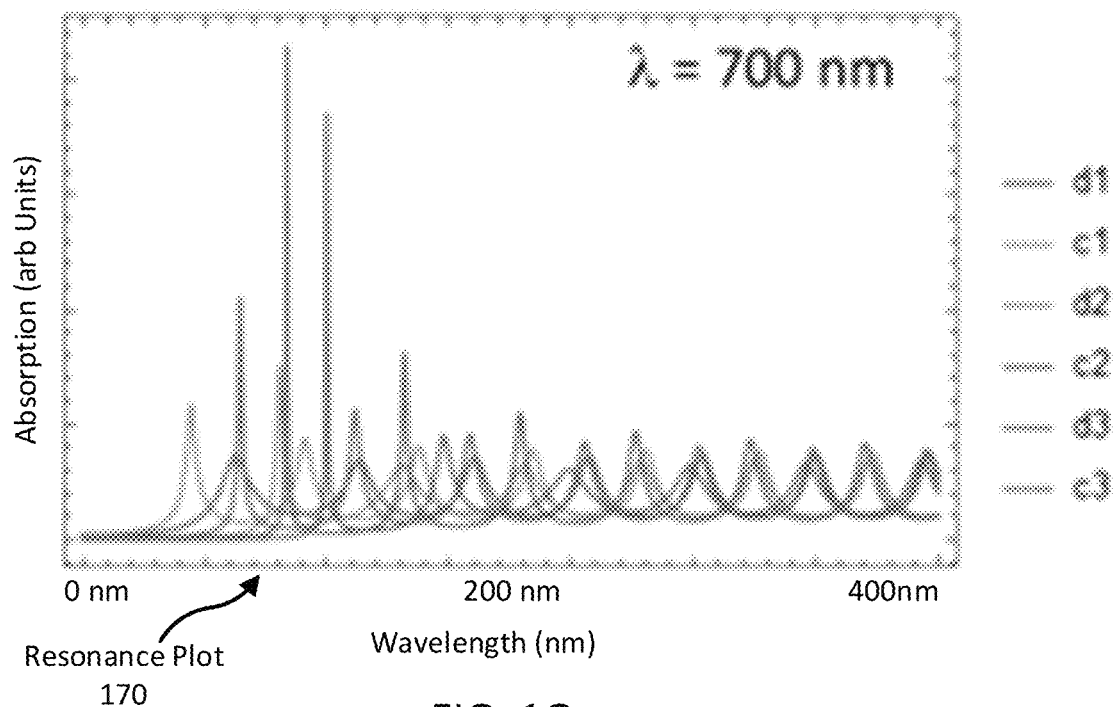
Figure 1H:
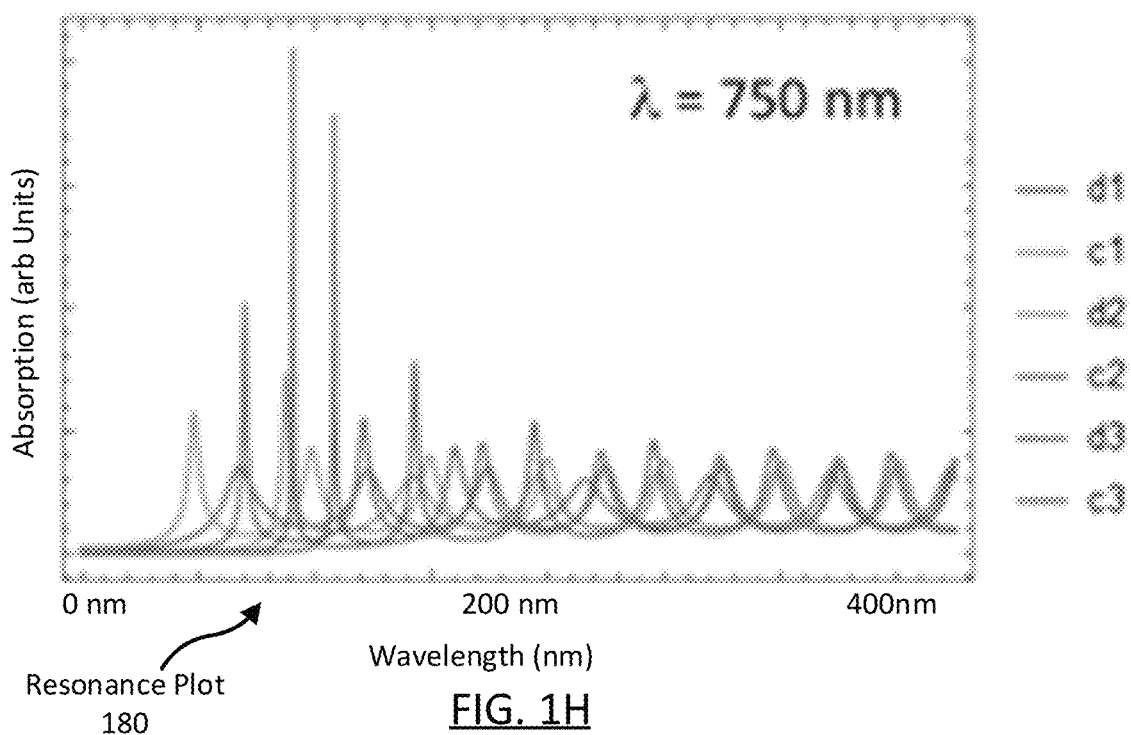

FIGS. 1A-1H illustrate a series of resonance plots, according to several example embodiments. A resonance plot illustrates the magnitude of an absorption coefficient as a function of scattering center size. Each resonance plot includes several different absorption coefficients d1, d2, d3, c1, c2, and c3, calculated according to the definitions described above. In other words, each resonance plot shows the first 3 multipoles (e.g., n=1, 2, and 3) for both $c_n$ and $d_n$ as functions of sphere radius. FIG. 1A is a resonance plot 110 for incident light having a wavelength of 400 nm. FIG. 1B is a resonance plot 120 for incident light having a wavelength of 450 nm. FIG. 1C is a resonance plot 130 for incident light having a wavelength of 500 nm. FIG. 1D is a resonance plot 140 for incident light having a wavelength of 550 nm. FIG. 1E is a resonance plot 150 for incident light having a wavelength of 600 nm. FIG. 1F is a resonance plot 160 for incident light having a wavelength of 650 nm. FIG. 1G is a resonance plot 170 for incident light having a wavelength of 700 nm. FIG. 1H is a resonance plot 180 for incident light having a wavelength of 750 nm.

Mie photo sensors can be many shapes. The example illustrated regarding FIGS. 1A-1E is spherical, however, Mie photo sensors may be rectilinear, close to rectilinear, or some other geometric shape. Rectilinear or nearly rectilinear Mie photo sensors may be created using semiconductor fabrication techniques. In the case of a rectilinear sensor, the solution to the scattering problem cannot be solved analytically, but it can be solved numerically.

Figure 2:
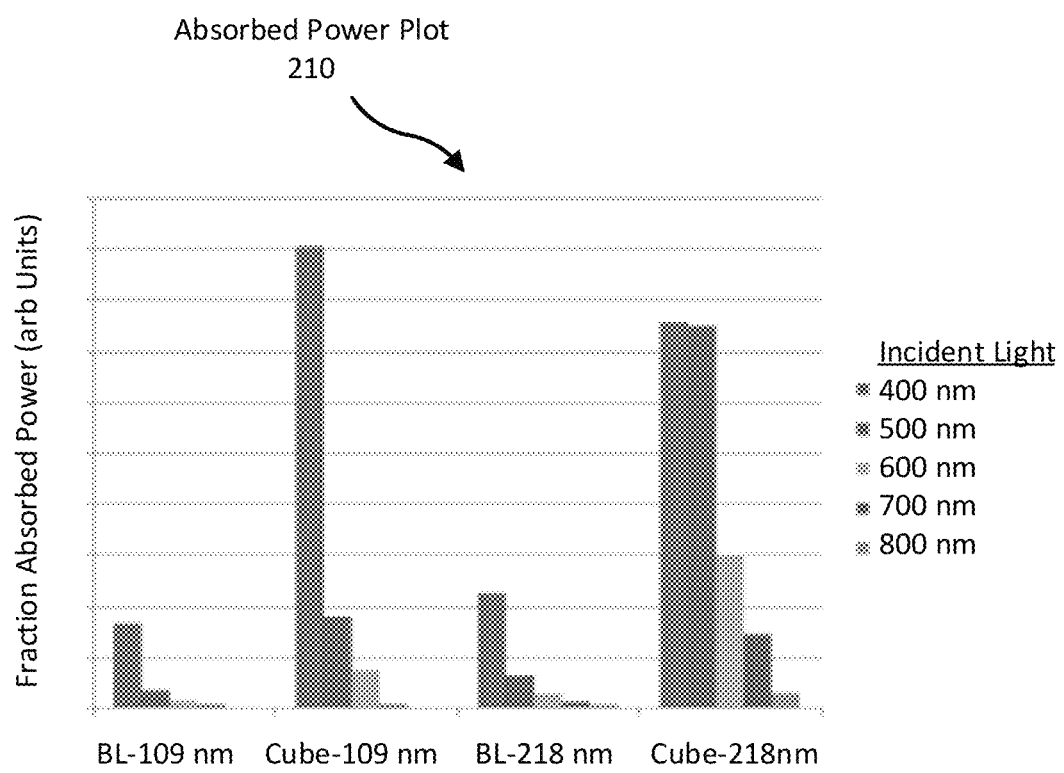
FIG. 2 illustrates an absorbed power plot for a rectilinear Mie photo sensor, according to one example embodiment.

For example, FIG. 2 illustrates an absorbed power plot for a rectilinear Mie photo sensor, according to one example embodiment. The absorbed power plot 210 shows a numerically calculated ratio of absorbed power to incident power for different wavelengths of light. The absorbed power is calculated using both (i) Mie solutions for a rectilinear photo sensor (labelled "cube"), and (ii) solutions for the rectilinear photo sensors as predicted by physical optics calculations (labelled "BL"). The absorption coefficients are calculated for two different rectilinear photo sensors: (i) a first device having 109 nm sides, and (ii) a second device having 218 nm sides. Additionally, the absorption coefficients are calculated for five different wavelengths of light (e.g., 400 nm, 500 nm, 600 nm, 700 nm, and 800 nm).

The absorbed energy of the first device shows the enhanced absorption of 400 nm light when accounting for Mie scattering. This is expected given the results in the plots of FIG. 1. The absorbed energy of the second device shows a more uniform absorption profile. Notably, several of these absorption ratios are greater than 1. The ratio demonstrates that when accounting for Mie scattering, a device has an optical cross section exceeding its physical cross section.

For comparison, the absorbed energy for the first device as predicted by physical optics is also shown for both sizes of detectors. In these examples, the reduction of absorbed power of a factor of between 4 and 6 exists for all wavelengths because of the absence of the internal concentration arising from Mie scattering.

The results in FIGS. 1A-H and FIG. 2 indicate strategies to both achieve broad wavelength response and to perform multispectral imaging. That is, in a first approach, implementing several Mie photo sensors with sizes and shapes that don't contain a high intensity resonance in either $c_n$ or $d_n$ allows for a broader wavelength response for a photo sensor. In a second approach, implementing multiple Mie photo sensors, each with slightly different geometries, located such that each photo sensor measures similar spatial information in the image plane, allows for multispectral imaging. In this case, signals from the multiple detectors can be summed, averaged with a uniform weighting, or combined in some other functional form to deliver a desired wavelength response in combination with desired noise and sensitivity requirements.

III.B The Structure and Physics of Mie Photo Sensors

Figure 3A:
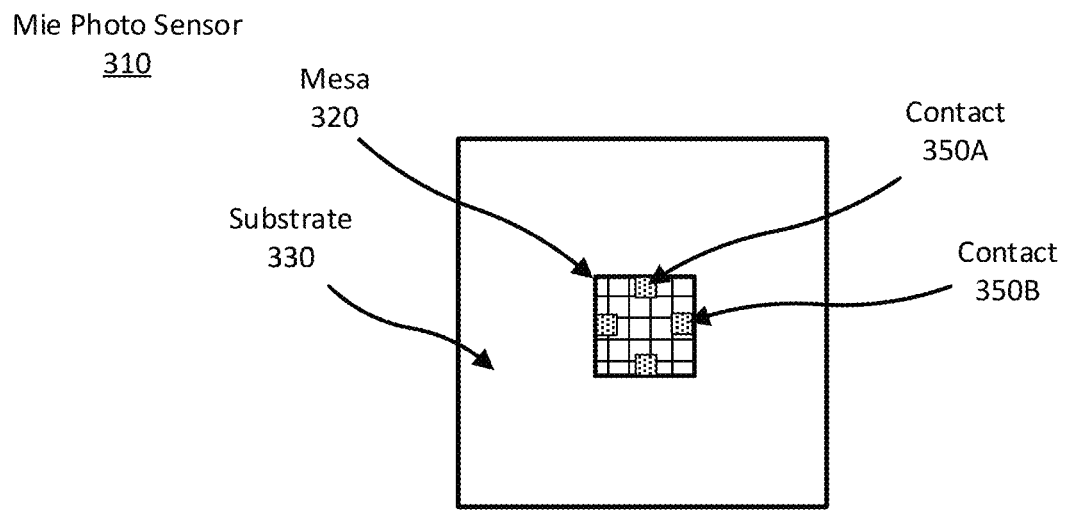
FIG. 3A illustrates top down view of a Mie photo sensor, according to one example embodiment.
Figure 3B:
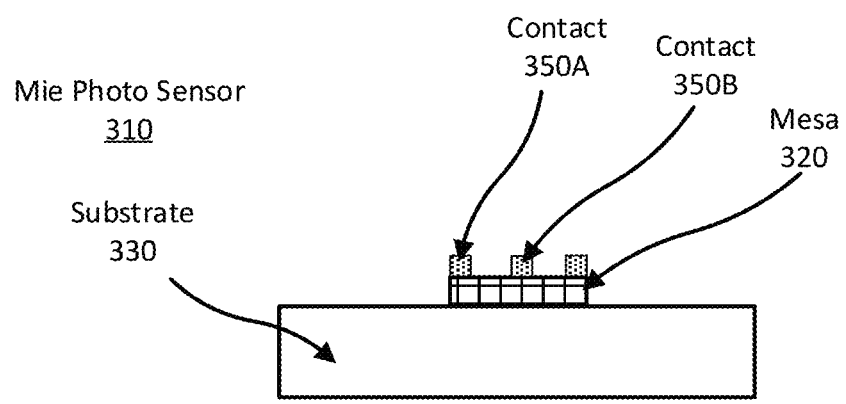
FIG. 3B illustrates a side view of a Mie photo sensor, according to one example embodiment.

FIG. 3A illustrates top down view of a Mie photo sensor, and FIG. 3B illustrates a side view of a Mie photo sensor, according to one example embodiment. In this example, the Mie photo sensor 310 includes rectangular parallelepiped mesas 320 of n-type gallium arsenide. The mesas 320 are sitting on, and attached to, a substrate 330 of intrinsic gallium-arsenide layers. Here, the mesas 320 are an example of a scattering center for a Mie photo sensor. In other embodiments, however, the scattering centers may take any other number of shapes or sizes.

In this example, the mesa 320 is formed by growing a layer of 100 nm thick n-type gallium arsenide on 2000 nm thick intrinsic gallium arsenide substrate 330. Subsequently, a combination of photo-resist application, photo-resist patterning with optical lithography and/or electron-beam lithography, and etching was utilized to fabricate the Mie photo sensor. In this way, the fabrication process removed defined portions of the n-type gallium arsenide leaving behind individual mesas 320. The mesa 320 was also fabricated such that each side of the mesa was 250 nm×250 nm. Other examples, such as 500 nm×500 nm sides are also possible.

Subsequent processing steps created an ohmic contact 350A and Schottky contact 350B on the mesa 320. The processing also created conducting traces to electrically access the contacts 350, although they are not pictured.

The Mie photo sensor 310 could have other dimensionalities or any other number of contacts 350. Further, the contacts could be some other type of contact such as a p-n, or p-i-n, semiconductor junctions.

Figure 4:
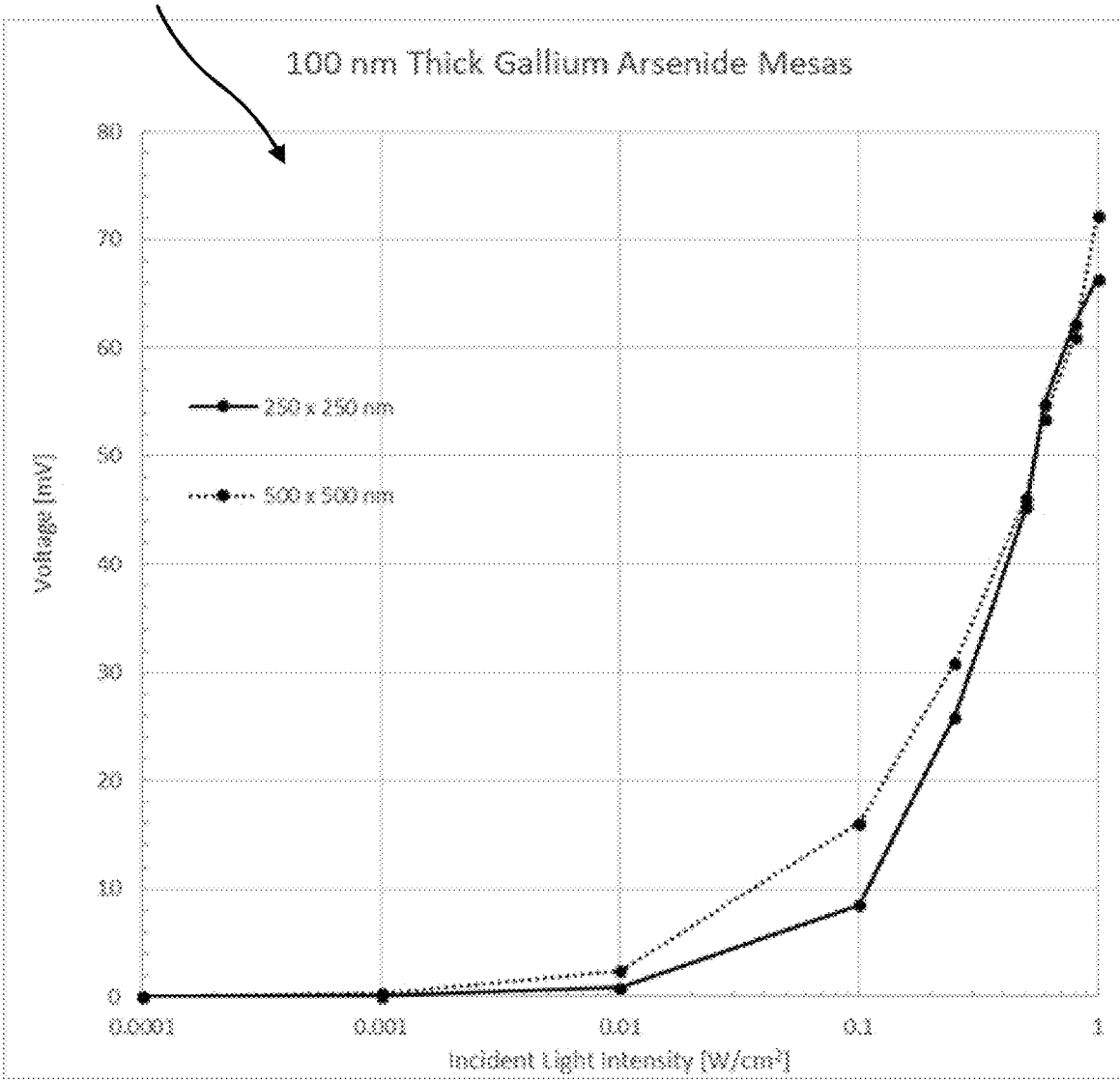
FIG. 4 illustrates a voltage response plot for a Mie photo sensor, according to one example embodiment.

FIG. 4 illustrates a voltage response plot for a Mie photo sensor, according to one example embodiment. A voltage response plot shows the open-circuit voltage response between the Schottky contact (e.g., 350B) and an ohmic contact (350A) as a function of incident light intensity for an Mie photo sensor (e.g., Mie photo sensor 310). In the illustrated example, the open circuit voltage is shown for both 250 nm square and 500 nm square gallium arsenide mesas exposed to normally incident light. Additionally, the estimated Schottky barrier height of the Schottky contact is 0.48 eV, but could be any other barrier height.

The illustrated example shows enhanced absorption stemming from Mie scattering. For example, here, the mesas were exposed to collimated incident 632.8 nm wavelength light normal to the top surface of the Mie photo sensor. If the physical optics approximation is assumed for this example, 37% of the light should be reflected from the surface, and, of the remainder, 32% should be absorbed in the mesa for a total absorbed energy of 21% of the total incident light. However, in this example, the measured signal indicates that at least twice as much light is absorbed in the Mie photo sensor than expected. That is, there is more absorption than expected when assuming the ideal maximum derived using the principles of physical optics.

The enhanced response shown in FIG. 4 is illustrative of the internal concentration effect of Mie scattering described above. Subsequent modelling results support this conclusion. In example, a dielectric object can support the internal energy concentration indicative of Mie scattering for isolated scattering centers when the dielectric object is in close planer contact with a macroscopically large slab of material having essentially the same complex index of refraction. Energy concentrations for these dielectric objects indicate that connected elements fabricated directly from wafers of semiconductor material are suitable structures for these detectors.

In a conventional photo sensor, mesas (e.g., a Mie scattering sensor) do not exist. Instead, these systems include a thickness of semiconductor materials acts as an absorbing medium and, at one or more locations, either differentially doped semiconductor or a thin metal layer is used to establish a depletion region. The depletion regions drive collection of the locally generated, photo-produced, charges. In the case of an array, the individual pixels can be, separated by materials to block exchange of photons or charge. Shrinking an array's areal dimensions so that individual pixels are smaller than the incident light's wavelength does not yield an array of Mie photo sensors. Further, shrinking the array thickness so that it is optically thin does not create an array of Mie photo sensors. Generally, small adjacent (traditional) photo sensors form a larger structure with a continuous index of refraction. In contrast, in an array of Mie photo sensors, individual photo sensors have the appropriate dimensions as discussed herein. Further, each Mie photo sensor is largely surrounded by material having a different index of refraction from the pixel itself to define the scattering center and further enable Mie scattering.

Furthermore, generally, individual conventional photo sensors are surrounded by additional semiconductor materials that support the signal collection electronics. Upon reducing the photoactive region of the sensor to dimensions of a Mie photo sensor, this additional material in combination with the photoactive region forms a larger structure that does not define a discreet dielectric scattering center as is required for Mie photo sensors.

Figure 5:
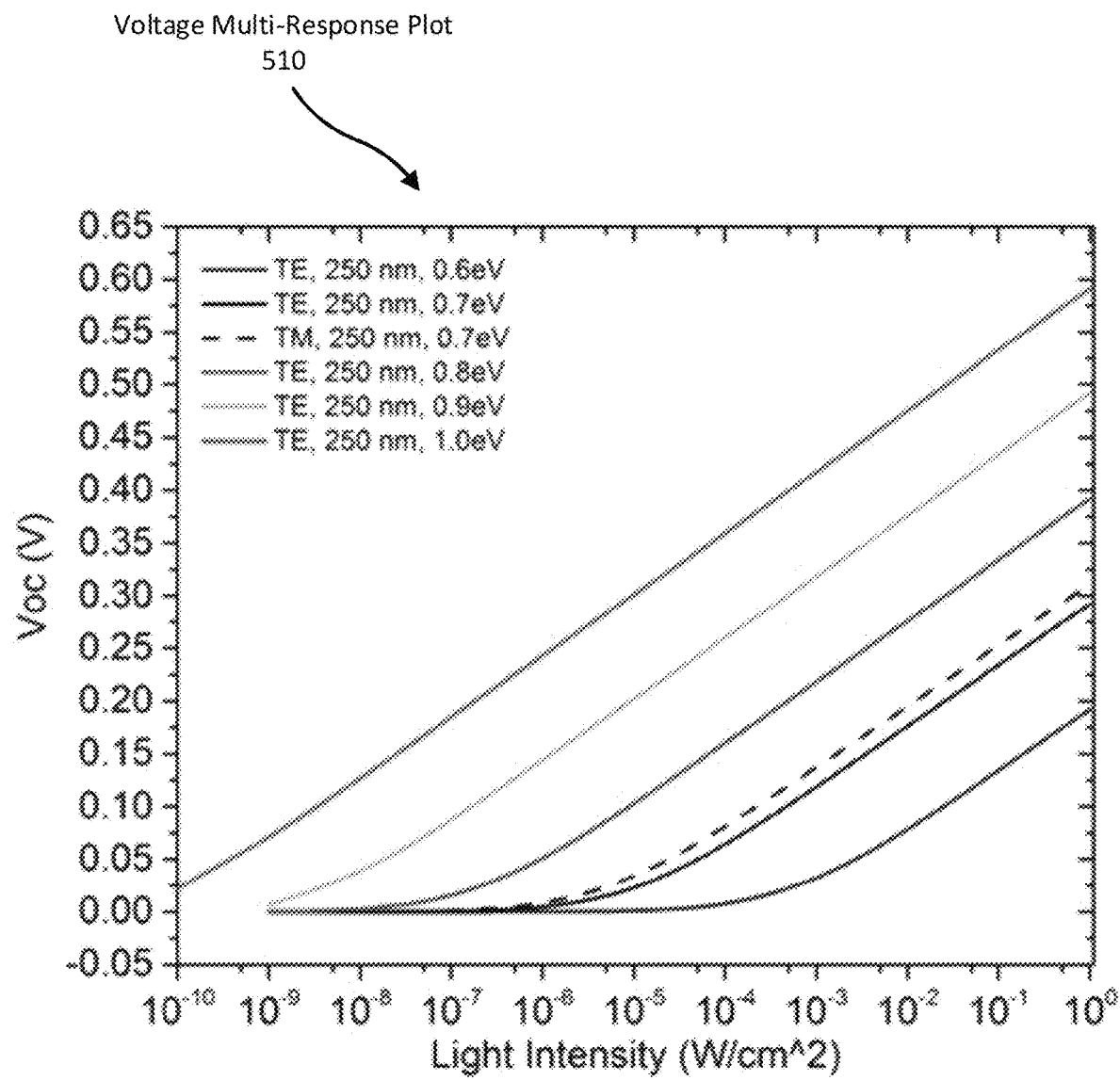
FIG. 5 is a voltage multi-response plot, according to one example embodiment, according to one example embodiment.

The Schottky barrier height of a contact in a Mie photo sensor can affect its operation. For example, FIG. 5 is a voltage multi-response plot, according to one example embodiment. The voltage multi-response plot 510 shows a simulated open-circuit voltage for the Mie photo sensor in FIG. 3, but for different barrier heights of the Schottky junction. In the voltage multi sensor plot, the open circuit voltage is measured for the same wavelength of light for each Schottky barrier.

Figure 6:
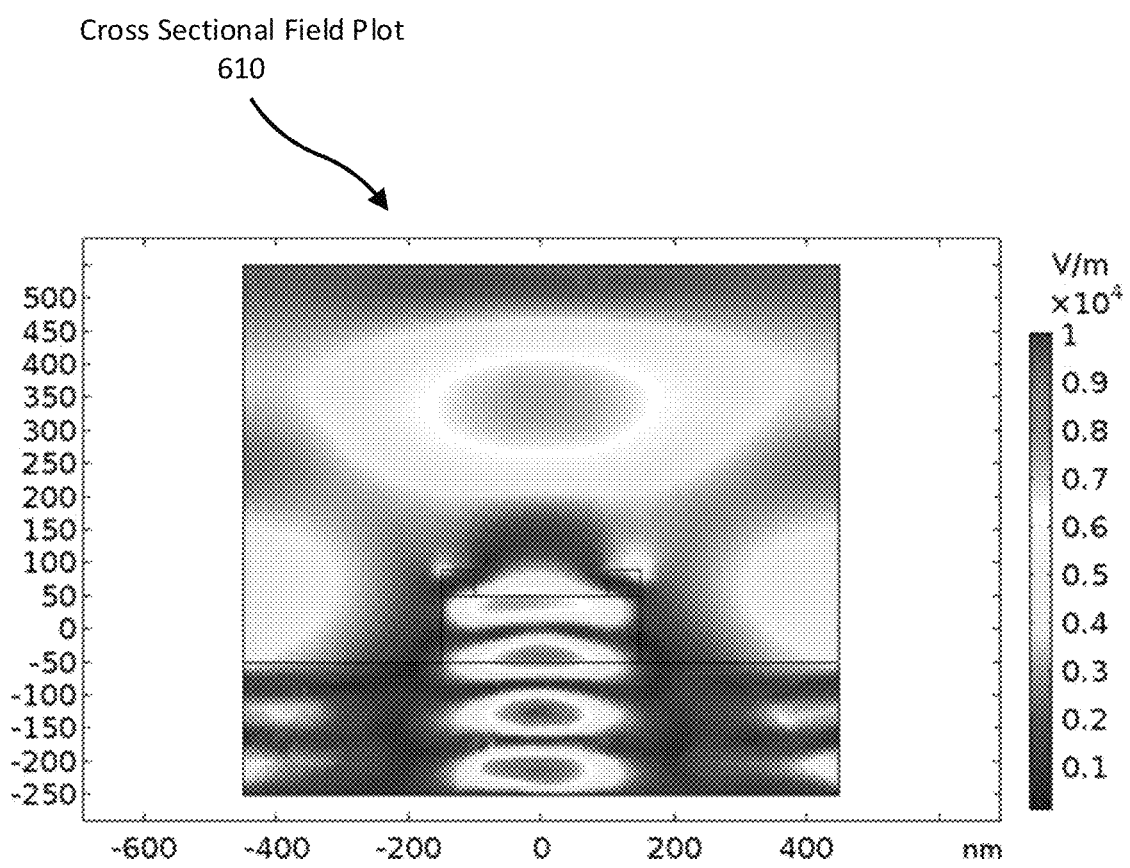
FIG. 6 illustrates a cross-sectional field plot 600 of a Mie photo sensor, according to one example embodiment, according to one example embodiment.

As described above, the internal electric and/or magnetic field of a Mie photo sensor is larger than their conventional photo sensor counterparts. To illustrate, FIG. 6 illustrates a cross-sectional field plot of a Mie photo sensor, according to one example embodiment. The cross-sectional field plot 600 illustrates the electric field in and around a Mie photo sensor. The illustrated Mie photo sensor is the Mie photo sensor 310 shown in FIG. 3. Additionally, the Mie photo sensor is fabricated on a 1000 nm×1000 nm×200 nm thick Si substrate (e.g., substrate 330). The Mie photo sensor is subject an incident plane wave of wavelength 600 nm, which induces large electromagnetic fields localized inside the mesa and inside the silicon substrate directly below the mesa.

Figure 7:
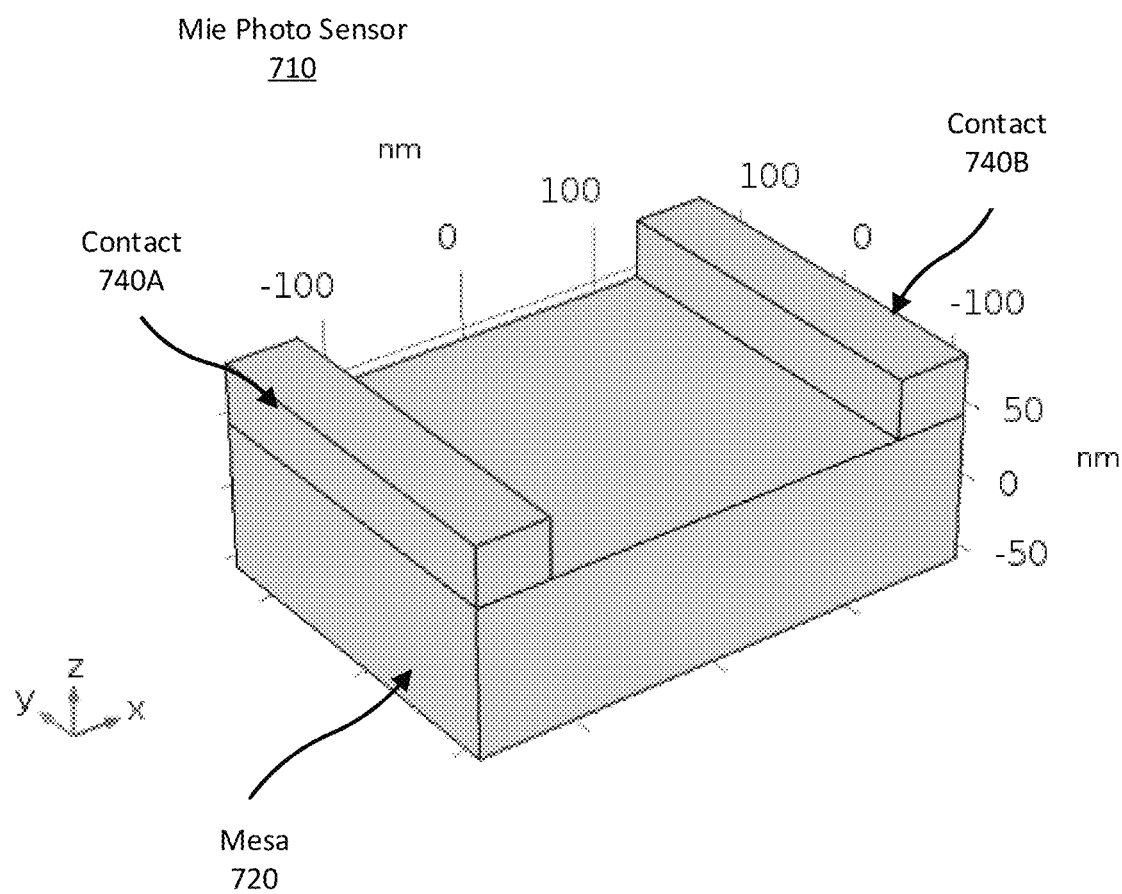
FIG. 7 illustrates a Mie photo sensor, according to one example embodiment, according to one example embodiment.

FIG. 7 illustrates a Mie photo sensor, according to one example embodiment. In this example, the Mie photo sensor 710 a mesa of silicon 350 nm×250 nm×100 nm thick with two metal strips (e.g., contacts 720A and 720B) forming contacts to the mesa 710. Each of the contacts 720 is 250 nm×50 nm×50 nm high. One contact 720A forms a Schottky contact with the mesa 720, the other contact 720B forms an ohmic contact with the mesa. Simulation results of absorbed power as a function of substrate under the mesa reinforces the result that scattering centers can support Mie scattering induced internal energy concentrations.

Figure 8:
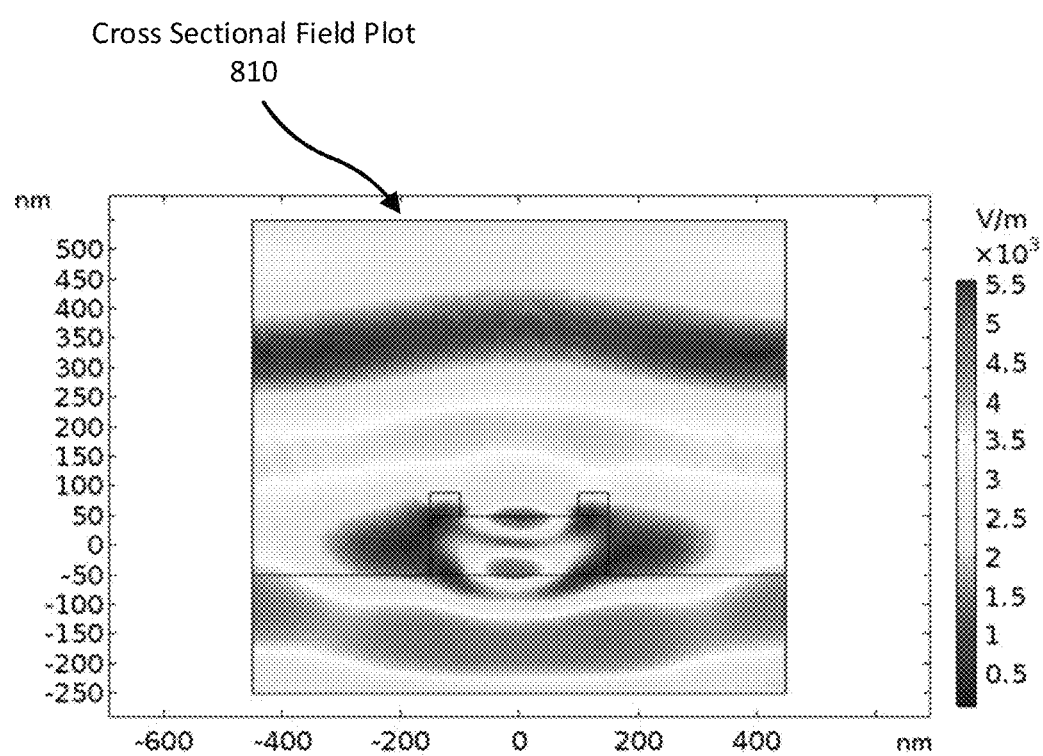
FIG. 8 is a cross-sectional field plot of a Mie photo sensor, according to one example embodiment, according to one example embodiment.

FIG. 8 is a cross-sectional field plot of a Mie photo sensor, according to one example embodiment. The cross-sectional field plot 700 illustrates a cross-sectional view of the Mie photo sensor 710 of FIG. 7. The cross-sectional field plots shows the electric field in and around the device. However, in this example, the Mie photo sensor is fabricated on a 1000 nm×1000 nm×200 nm thick silicon dioxide substrate subject to an incident plane wave of wavelength 600 nm.

In this example, the substrates is silicon dioxide (an insulator), rather than a semiconductor (e.g., silicon). The silicon dioxide substrate allows for a discontinuous index of refraction completely around the mesa. Additionally, the silicon dioxide strongly supports reflections of a plane wave incident on the substrate along its front and back surfaces. Interference effects between the incident and plane waves and reflected plane waves dominate the electric field intensity map in the substrate and surrounding vacuum. The interference effects reduce the internal concentration effect in the mesa which is seen in a reduction in the maximum electric field intensity. Comparing FIG. 6 and FIG. 8 suggests that the sensitivity of Mie photo sensors on the silicon substrate have a minimum sensitivity of between 1 and 2½ orders of magnitude lower light level (depending on mesa doping, Na) than does the device on the silicon dioxide substrate.

Figure 9:
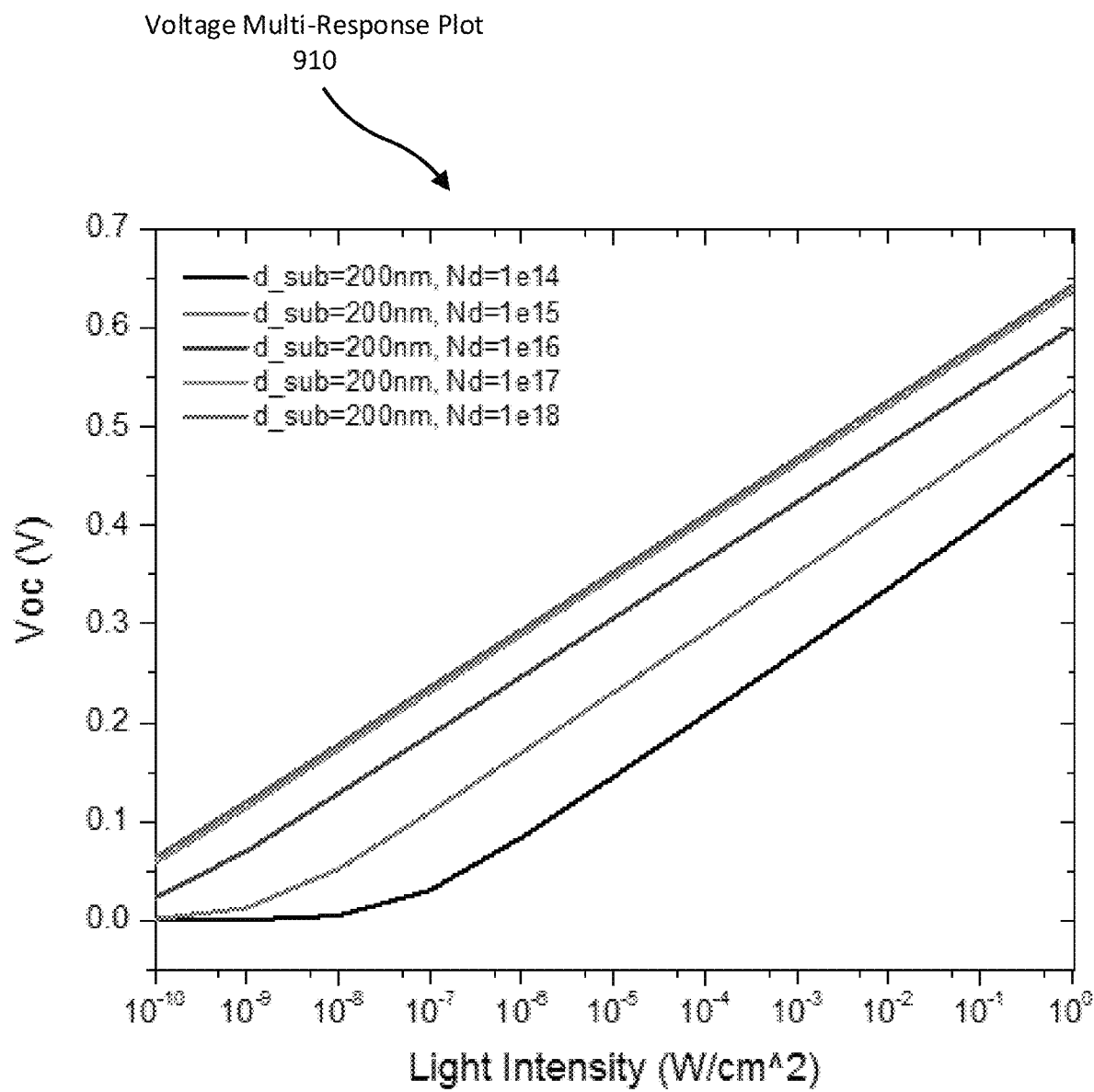
FIG. 9 illustrates a voltage multi-response plot, according to one example embodiment, according to one example embodiment.

FIG. 9 illustrates a voltage multi-response plot, according to one example embodiment. The voltage multi-response plot illustrates the open-circuit voltage induced between the two metal contacts of the Mie photo sensor in FIG. 5. Here, the voltage response is in response to incident 600 nm light of varying intensities on a Mie photo sensor fabricated using silicon on a silicon substrate. Additionally, in this voltage response plot 910, rather than each line conveying a different Schottky barrier height, each line in the plot represents a different doping level of the mesa of the Mie photo sensor. In both a silicon and silicon dioxide substrate case, the Schottky barrier height is assumed to be 1.0 eV. The Schottky barrier induces a depletion region in the semiconductor volume adjacent to it and has a built-in voltage that reflects the equilibrium state of the system. The addition of photo-produced electron-hole pairs changes this built-in voltage which is measurable as the open-circuit voltage between the two metal contacts. The open-circuit voltage is proportional to the log of the production rate of photo-generated carriers.

A Mie photo sensor on a silicon substrate is, generally, more sensitive than a Mie photo sensor on a silicon dioxide substrate and indicates the importance of mesa and substrate composition. There are other ways of enhancing optical detection performance (e.g., sensitivity) as well. One example is to decrease the area of the Schottky contact. Decreasing the Schottky contact area can reduce the saturation current across the barrier and this significantly increases the device sensitivity. Further, decreasing the Schottky contact area can enable engineering of the free carrier gradient and thereby control the diffusion rates. Controlling diffusion rates enables control over cross-talk between sensors on a non-insulating substrate such as intrinsic silicon. In addition, changing the size and shape of the metal contacts can serve to further define the interaction between the detector and the incoming wave.

Figure 10A:
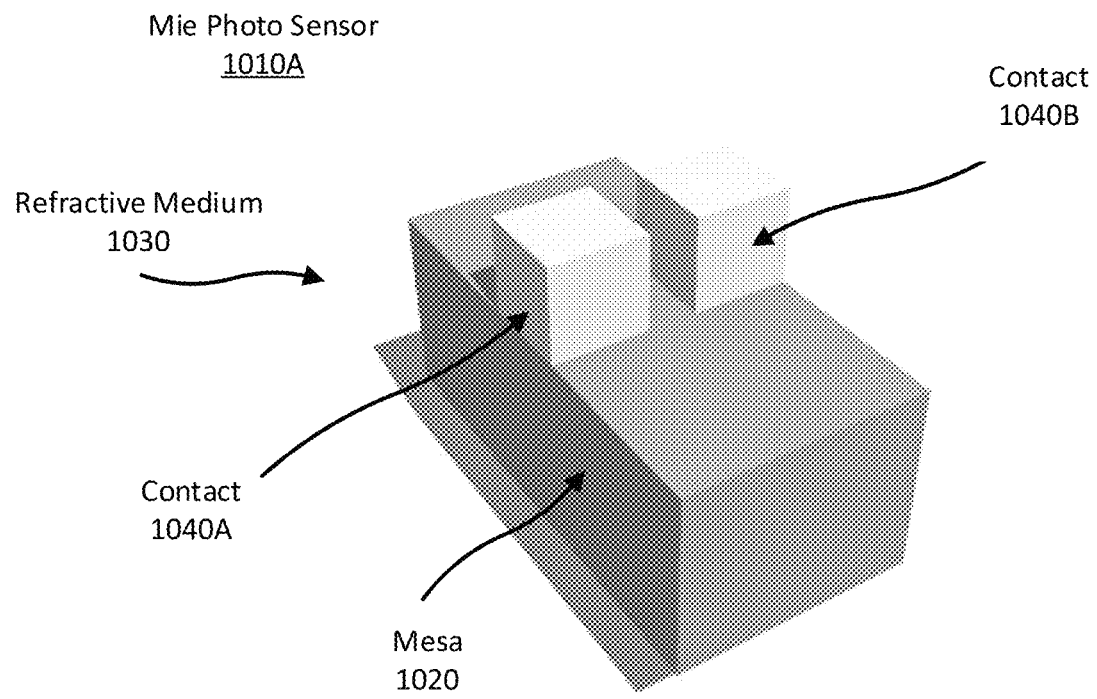
FIGS. 10A-10C illustrate various configurations of a Mie photo sensor, according to some example embodiments.
Figure 10B:
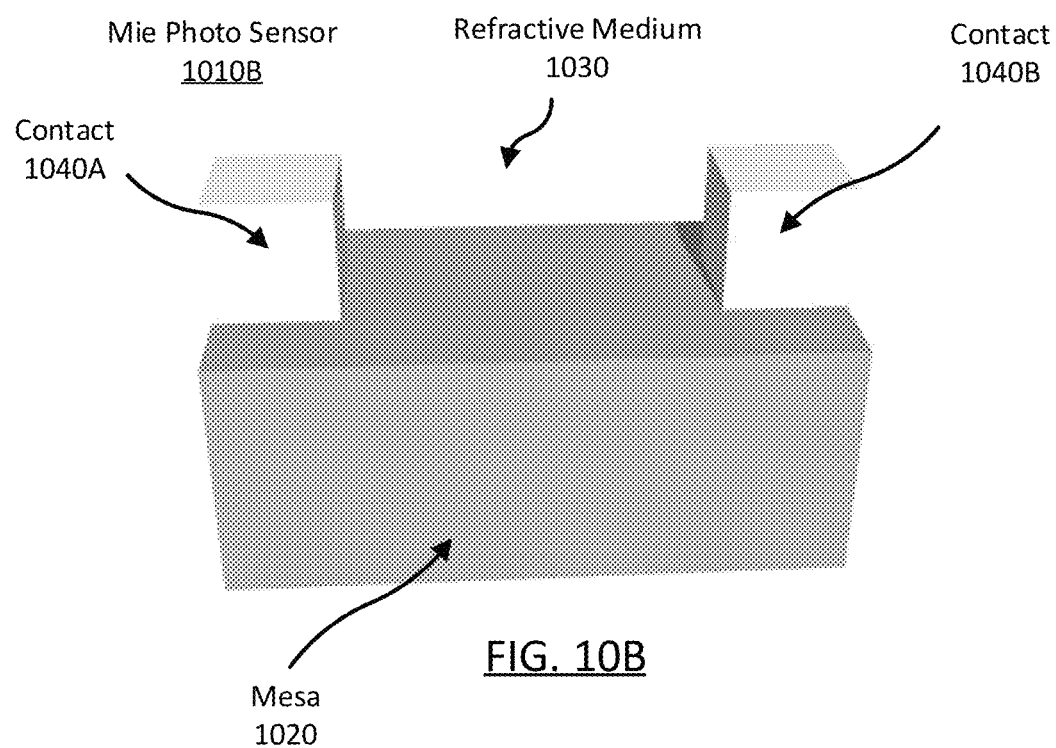
Figure 10C:
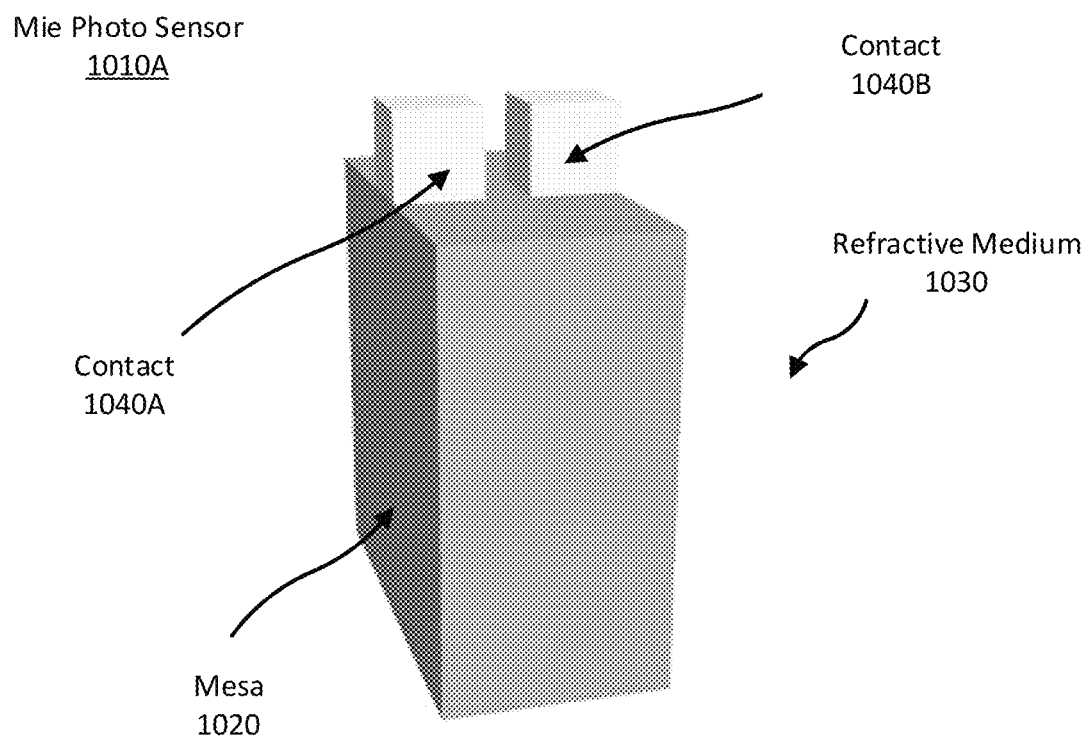

FIGS. 10A-10C illustrate various configurations of a Mie photo sensor, according to some example embodiments. Each of the figures illustrates a different configuration of Mie photo sensor, but all of the Mie photo sensors at least include a substrate (not illustrated, for clarity). The substrate is a material layer having a first index of refraction and comprising a mesa 1020 of semiconducting material. The mesa has a second index of refraction and is configured to generate free carries within the semiconducting material in response to an electromagnetic perturbation (e.g., visible light, x-rays, infrared radiation, etc.). The mesas 1020 are surrounded by a refractive medium 1040 (e.g., air) having a complex (e.g., third) index of refraction. Generally, the third index of refraction is lower than the first and second indices of refraction. In some cases, where the material of the mesa and the substrate are similar, or the same, the index of refraction for the two materials may be similar, or the same.

Together, the refractive medium 1040 and the mesa 1020 (and/or substrate) form an interface with an index of refraction across the interface that is discontinuous. That is, the refractive medium 1040 may comprise some material which has a different real part of the refraction index than does the mesa 1030. Ideally, the discontinuity refractive index should be as large as possible across the boundary between the mesa 1030 and the refractive medium. For example, in the case of a rectilinear silicon mesa with air on 5 sides, the refractive index discontinuity between the mesa and the air refractive medium is between 5.3 and 3.7 across the visible spectrum.

In the case of gallium arsenide subject to 546 nm incident light, refractive index discontinuity between the mesa and the refractive medium is 4.0.

The, the mesa of semiconducting material within the refractive medium may form an electromagnetic scattering center for the Mie photo sensor. In some cases, the scattering center may be some portion of the mesa rather than the entirety of the mesa. In other words, the mesa may be described as having a geometric shape with a set of boundaries, and the electromagnetic scattering center may be any portion of the semiconducting material of the mesa within, and up to, those boundaries.

The Mie photo sensors include at least one contact 1050 (e.g., contacts 1050A and 1050B) contacting the mesa 1020. The contacts 1050 may be any combination of ohmic contacts, Schottky contacts, p-n junctions, or p-i-n junctions. In a configuration where both contacts 1050 are Ohmic, at least one of the interfaces between the refractive material (or substrate) and the mesa 1030 is a Schottky barrier.

In various configurations, Mie photo sensors 1010 may include asymmetric mesas which can be used to change the photo sensor's response to polarization of the incoming light. Highly asymmetric mesas will present different effective spatial dimensions to light with different orientations of its constituent fields. For example, the Mie photo sensors 1010 in FIGS. 10A-10C show mesas 1020 with different aspect ratios in relation to both the incoming light and to the contacts. In this way, particular polarization states of the incoming light can be individually measured, and/or particular wavelengths of incoming light can be resonant in the photo sensor. Polarization dependent measurements can deliver important information about the composition of light reflecting or light emitting objects.

Mie photo sensors can be configured to absorb designed a particular wavelength of light. For example, the size, shape, material, etc. of a scattering center can be configured to absorb a particular wavelength. In this case, Mie scattering absorbs the particular wavelength of electromagnetic perturbation at a resonance level and generates a first amount of free carries corresponding to the resonance level. The electromagnetic scattering center may also absorb different wavelengths of electromagnetic perturbation at non-resonance levels and generate a second amount of free carriers corresponding to the non resonance level. The number of free carriers generated from light at the particular wavelength (e.g., resonance) is greater than the number of carriers generated from carriers at different wavelengths (e.g., non-resonance).

Generally, an individual Mie photo sensor is configured to a narrow wavelength response, but multiple Mie photo sensors can be configured for different wavelength responses such that an array of Mie photo sensors absorb a broad range of wavelengths. In this way, the intensity variation as a function of wavelength can be discerned for several spectrums of incoming light.

These configurations of Mie photo sensor presented herein are given as means of example and are not intended to be limiting. More specifically a Mie photo sensor can be any configuration of photo sensor that utilizes Mie scattering to enhance photo-current generation in a photo sensor.

For example, a Mie photo sensor can have various types of substrates. Some example substrates include: carbon (e.g., diamond, and diamond with nitrogen vacancies, etc.), gallium arsenide, mercury cadmium telluride, platinum silicide, germanium, thallium bromide, etc. Further, each of the substrate materials may be selected such that the Mie photo sensor is configured have a resonance for a particular type of electromagnetic perturbation. For example, Mie photo sensors including a substrate comprising (i) carbon may have a UV an X-ray resonance, (ii) mercury cadmium telluride may have a broad infrared resonance, (iii) platinum silicide may have an infrared resonance, (iv) germanium may have a gamma ray resonance, and thalium bromide may have an x-ray resonance.

As another example, a Mie photo sensor may have a height between 30 nm and 1700 nm. Where the height of the Mie photo sensor is measured in a perpendicular direction relative to the surface of the substrate. Again, the height of the Mie photo sensor can influence the particular wavelength of electromagnetic perturbation that causes a resonance in free carrier generation, and/or a particular polarization of light that causes a resonance in free carrier generation.

As another example, a mesa may have different planar sizes. To illustrate a mesa may have a first feature in a first direction between 10 nm and 800 nm and a second feature in a second direction between 10 nm and 800 nm, where the first and second directions are approximately orthogonal to one another. Again, the size of the first feature and the second feature can influence the particular wavelength of electromagnetic perturbation that causes a resonance in free carrier generation, and/or a particular polarization of light that causes a resonance in free carrier generation.

III.C Basic Operation of the Mie Photo Sensor Pixel

Mie photo sensors, like conventional photo sensors, can be deployed as pixels in imaging systems operating in either open-circuit or charge-collection mode.

As previously discussed, a non-ohmic contact may either be formed from a Schottky junction or a p-n junction. The advantage of Schottky junctions is that they provide very fast response times. Previously, Schottky junctions were seldom used in photo sensors because they typically have a higher dark current, which establishes an intensity floor below which measurements cannot be performed. In a Mie photo sensor, however, the area of the metal-semiconductor interface can be made extremely small which strongly reduces the junction dark current.

Mie photo sensors are attractive for deployment in the open-circuit mode because of the photo sensors fast response time and low minimum sensitivity. The fast response time enables equilibrium voltage measurements and the lower minimum sensitivity allows the voltage measurements to extend to lower incident intensities. Photo sensors operated in this mode have inherently large dynamic ranges due to this mode's logarithmic response; the improved minimum sensitivity suggests they can deliver a dynamic range significantly larger than the 6 decades demonstrated in other logarithmic detectors.

Another benefit of Mie photo sensors utilized in voltage mode is they can be operated without a bias voltage and without reset circuitry. The fast response possible with a Schottky contact, in combination with the small area contact enabled by the Mie photo sensors' small size, makes it possible to implement a direct voltage measurement of the Mie photo sensor's response to light without the need to add reset circuitry to the pixel.

FIGS. 11A-11E illustrate several different configurations for a pixel in an image sensor including one or more Mie photo sensors, according to various example embodiments. Each pixel 1110 comprises a mesa of semiconducting material 1120, a substrate 1130, a refractive material 1140 (air, as illustrated), and one or more contacts 1150. Further each of the pixels include some combination of control electronics to read information from, and control the pixel.

Figure 11A:
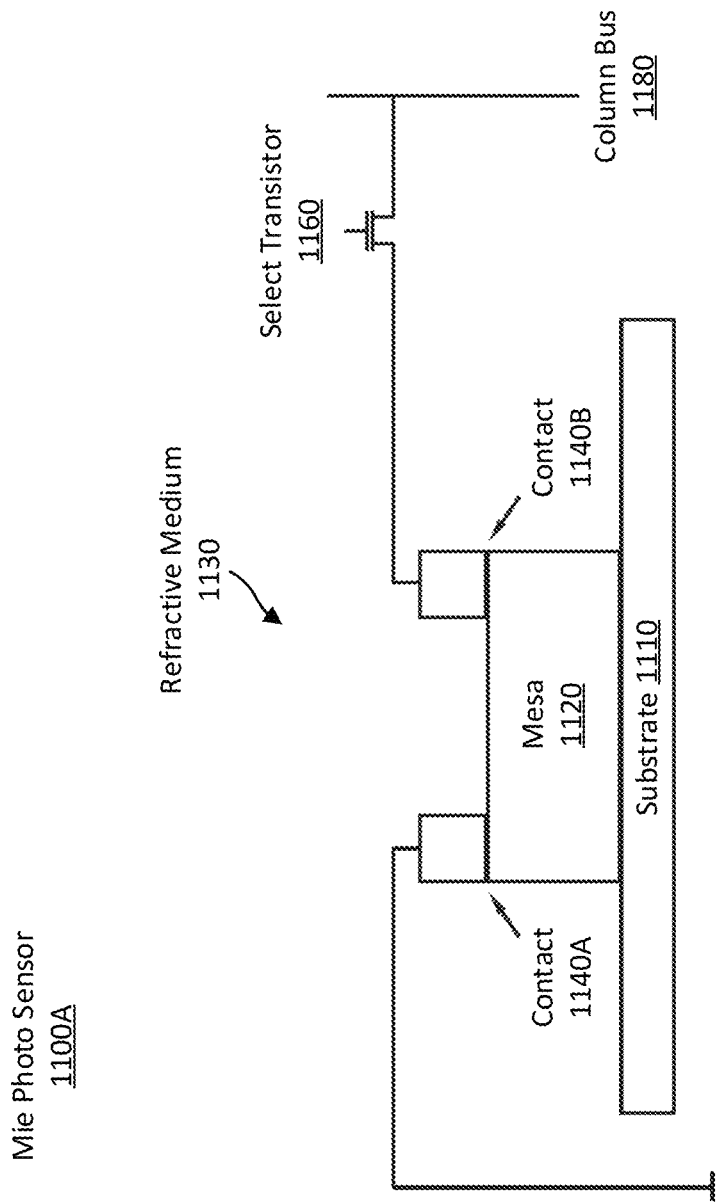
FIGS. 11A-11E illustrate several different configurations for a pixel in an image sensor including one or more Mie photo sensors, according to various example embodiments.

FIG. 11A illustrates an example pixel of an image sensor array including a Mie photo sensor, according to one example embodiment. In this example, the pixel 1100A comprises a single selection transistor 1160 connecting the column bus 1180 to the Mie photo sensor 1110. Because there is only a single selection transistor 1160, the pixel 1160 and Mie photo sensor 1110 deliver inherently low-power performance.

Figure 11B:
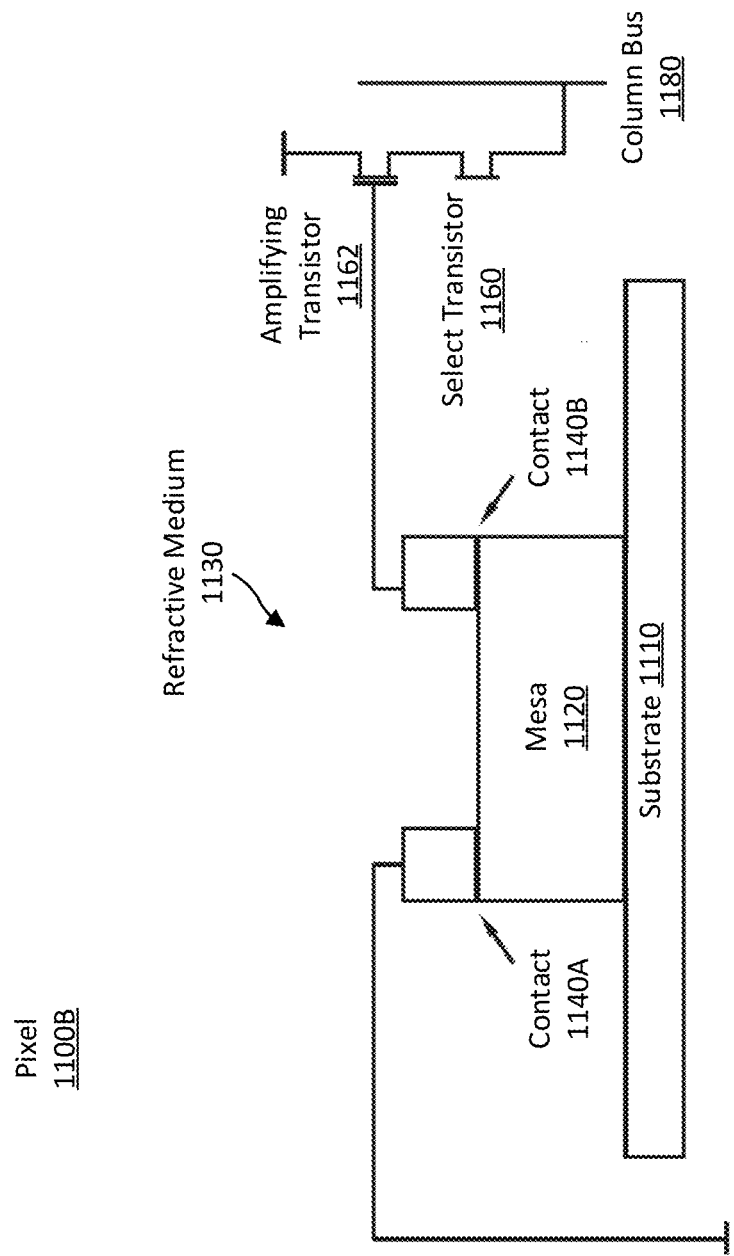

FIG. 11B illustrates an example pixel of an image sensor array including a Mie photo sensor, according to one example embodiment. In this example, the pixel sensor includes both a selection transistor 1160 and an amplifying transistor 1162. This configuration allows for the isolation of the capacitance of the Mie photo sensor from the rest of the column bus 1180 (and remaining readout circuitry). In addition, this configuration allows for the pixel to rescale (via the amplifying transistor 1162) the voltage output from the Mie photo sensor.

Figure 11C:
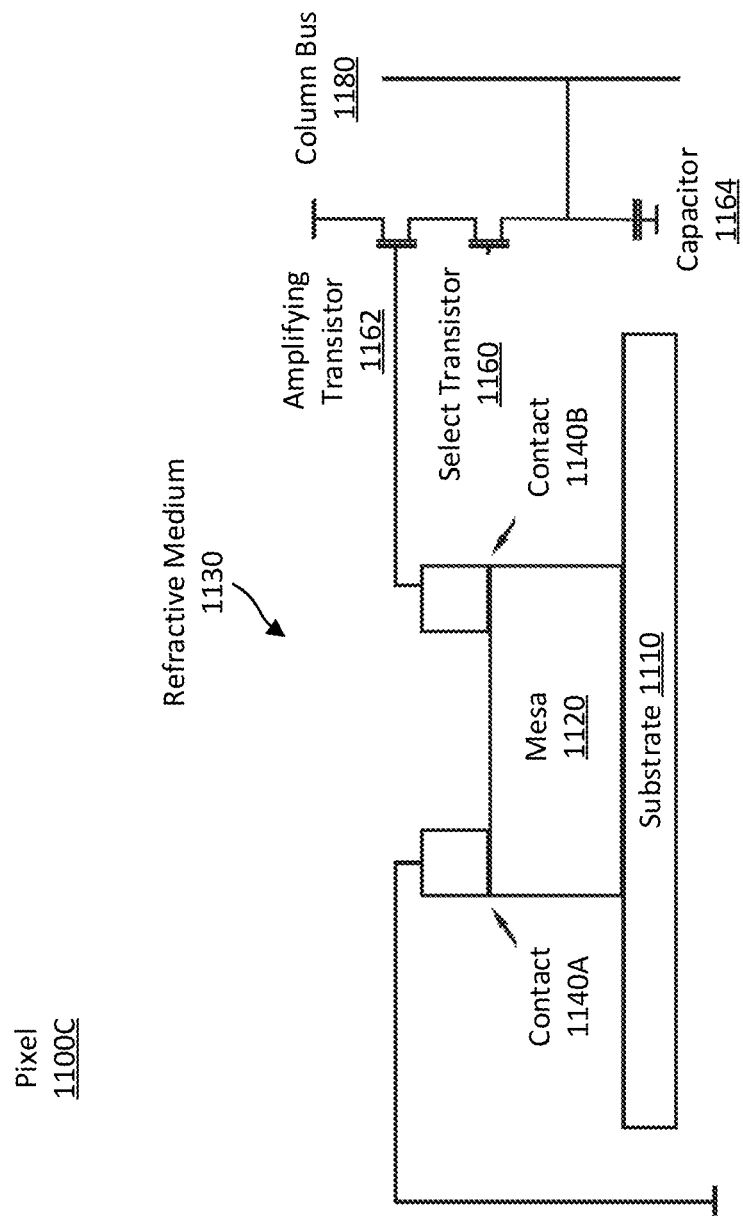

FIG. 11C illustrates an example pixel of an image sensor array including a Mie photo sensor, according to one example embodiment. In this example, the pixel includes a selection transistor 1160, an amplifying transistor 1162, and a capacitor 1164. Here, the output voltage can be temporarily stored across an appropriately sized capacitor 1164. The capacitance of the capacitor 1164 depends on the voltage difference of the circuitry (typically $V_{DD}$), the resistance of the readout circuitry, and the desired time response. This configuration of a pixel additionally allows for all the pixels in the array to be measured nearly simultaneously.

Figure 11D:
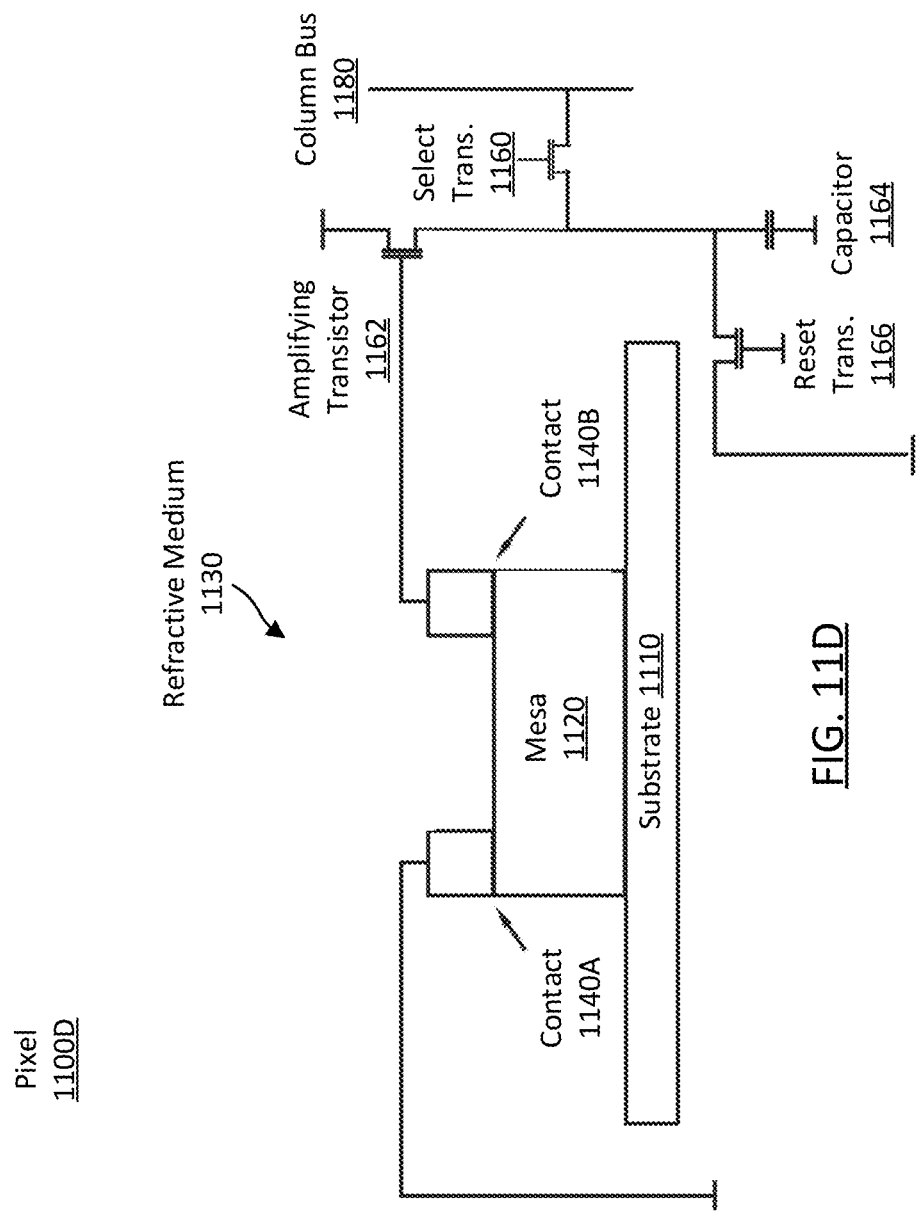

FIG. 11D illustrates an example pixel of an image sensor array including a Mie photo sensor, according to one example embodiment. In this case the pixel includes a selection transistor 1160, an amplifying transistor 1162, a capacitor 1164, and a reset transistor 1166. This configuration allows the pixel to reset the capacitor to its zero voltage difference state. Alternatively, or additionally, this configuration allows switching between a readout mode mediated by the voltage storing capacitor and one that is not. As an example of operation, when the selection transistor 1160 is "OFF," turning the reset transistor 1166 on serves the reset function. When the selection transistor 1160 is "ON," turning the reset transistor 1166 on serves to largely bypass the voltage storage capacitor.

Figure 11E:
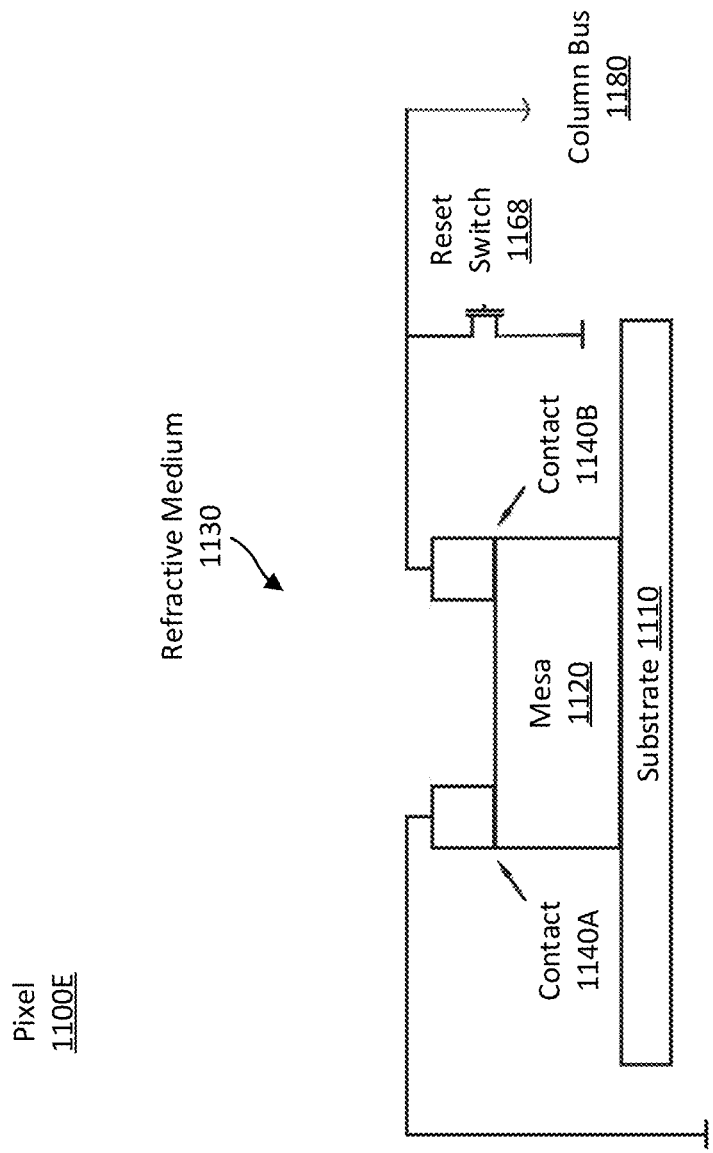

FIG. 11E illustrates an example pixel of an image sensor array including a Mie photo sensor, according to one example embodiment. As described above, in a Mie photo sensor with a Schottky junction, the response time of the Mie photo sensor is rapid. Accordingly, in cases where a p-n junction is used, an option to reset the sensor to its dark state may be desired. For example, here, the pixel 1110 includes a reset switch 1168.

FIGS. 11A through 11E are meant for illustrative purposes, and many other configurations are of pixels including Mie photo sensors are also possible. Additionally, any of combination of the functionality described above may be included in various pixels.

For Mie photo sensors implemented in the charge-collection mode, a smaller photo sensor size reduces the charge-collection time, thereby enabling increased frame rates. In addition, a reduction in saturation current makes the use of Schottky junctions (in place of semiconductor junctions) more widely feasible. Schottky junctions have inherently higher saturation currents then do semiconductor junctions which sets a correspondingly higher minimum sensitivity for photo sensors utilizing metal-semiconductor rectifying interfaces. In some example configurations, however, Mie photo sensors utilizing Schottky junctions have much faster response times which enables higher frame rates and the detection of short-period optical events.

Mie photo sensors can also be implemented in charge-collection mode with circuitry similar to that of pinned photo diodes. However, in open-circuit configurations, the absence of a transfer transistor between the photoactive sensor and the other in-pixel circuitry can result in improved performance by, for example, reducing dark current issues.

Mie photo sensors' optical cross-section exceeding their physical cross section means that Mie photo sensors can respond to the incident light that would normally strike the regions around and adjacent to the photosensitive are of the detector. This increases the effective fill factor of the imaging chip. Such regions can be occupied by the control and processing electronic circuitry. Such electronics can be used to enhance signal collection and amplification, for instance by implementing faster circuitry for high speed imaging or for enabling global, versus rolling shutter data collection and transfer.

III.D Design and Operation of the Mie Photo Sensor Array

Individual Mie photo sensors can be implemented as single sensor imaging devices using the same technique employed with an individual conventional photo sensor. In this case, the sensor is scanned across the image plane formed by a static object in order to construct an image. Again, as with conventional photo sensors, images may be formed by linear arrays of identical Mie photo sensors scanned across the image plane or by two-dimensional arrays of stationary Mie photo sensors. Like conventional photo sensor arrays, the pixel-to-pixel spacing can place an upper limit on the spatial frequency that can be captured in the image. This pixel-to-pixel spacing corresponds to a similar spatial-resolution metric in object space. Where direct imaging, without intervening optics, is used, the concept of a diffraction limit or Airy disk doesn't exist. Examples of such imaging include holography and contact imaging. The inability to provide finely spaced photo sensors has limited the widespread application of these techniques in many situations where they might be of value. In the case where optics is required, the limit of the spatial resolution of the object is a function of the optics transferring light from the imaged object to the image. For a given optical system, large pixel-to-pixel spacing can further limit the spatial detail that can be discerned in the object. For this reason, Mie photo sensors can also deliver improved spatial resolution when used in combination with imaging optics because of their reduced size and increased fill factor.

All the advantages of Mie photo sensors over conventional photo sensors discussed above can contribute to improved imaging performance in each of these cases. In addition, Mie photo sensor pixels are all compatible with image array enhancement methods currently used with conventional photo sensors. These methods include light-gathering improvements and noise reduction techniques such as micro-lenses, light guides, anti-reflective coatings, thinning interconnect layers and dielectrics, backside illumination, three-dimensional integration of integrated circuits, or stacked structures to separate photon detection from pixel readout and signal processing, double sampling methods, etc.

Several characteristics of Mie photo sensors each enable new ways to arrange and to use photo sensor arrays (either one-dimensional, two-dimensional or three-dimensional arrays). The characteristics can include, for example, a possibility of the Mie photo sensor size being smaller than the incident light's wavelength, a possibility of the optical cross section of a Mie photo sensor exceeding their physical cross section, and a possibility of designing the Mie photo sensor to exhibit resonances in wavelength and/or polarization, and the like. Taken together, these characteristics allow for new and powerful array designs.

Unless subwavelength diffraction effects are used in the image analysis, the meaningful grid for display or analysis purposes is one with grid nodes separated by a minimum of about one Airy disk diameter. Mie photo sensor sizes that are smaller than the wavelength of light make possible multiple measurements of each resolvable spot, or Airy disk, in the image. This holds independent of the f-number of the optics used to form the sought-after image. This rebinning of the spatially distributed intensity measurements can be thought of as defining effective pixels. Such effective pixels could be made larger than an Airy disk as well. In that case, the spatial frequency spectrum of the system's optics must be considered to minimize aliasing in the image. The spatial resolution of the image space is the resolution implied by the effective pixel distribution. The signal from the physical pixels within an effective pixel can be combined or kept separate.

Combining the signal from different photo sensors has been shown to substantially improve the signal-to-noise ratio in the final image as compared to using the signal from a single larger pixel that is the area of the sum of the smaller ones. This improvement is especially apparent at low light levels. With Mie photo sensors this can occur without compromising the image quality. In addition, with larger pixels such combinations, or upscaling, would result in the introduction of optical artifacts from aliasing. Mie photo sensors below the size of the Airy disc enables combining sensors without the presence of the high frequency optical components that lead to aliasing.

In some examples, signals from sensors within a single effective pixel are to be combined using on-chip electronics, off-chip electronics, or performed in software. When using on-chip electronics, combining signals can result in substantial reductions of on-chip circuitry. Combining signals do not have to be made using photo sensors on a regular grid. For instance, increasing the effective pixel area from the image array center to the edges yields a foveated pattern similar to that of the human eye. One advantage of irregular photo sensor patterns is they can deliver a higher spatial resolution signal at one or more parts of the image, but a lower noise and a higher dynamic range signal at other parts of the image.

Generating signal combinations generally reduces the data throughput rates and, particularly, reduces throughput rates for on-chip combining. However, data combination in software has advantages in flexibility. In cases where the objects in the image have unknown sizes or features, feedback or machine learning can be used to determine those objects. For example, different combinations of physical pixels can be combined into effective pixels in order to maximize detection and evaluation effectiveness.

Alternatively, keeping signals generated by the photo sensor separate enables multiple wavelength and/or polarization measurements of the incident light within each effective pixel. For example, in image sensors where the individual pixels are selecting pixels (designed to select specific wavelengths or polarizations), it may be advantageous to reduce signal combinations between different types of selecting pixels. In this way, each set of pixels with the same selection mechanism can be used to form an image with the spatial resolution of the effective pixel.

In some configurations, Mie photo sensors fabricated of the same material can be stacked such that each Mie photo sensor has a high absorption probability for light in a desired range of wavelengths while simultaneously remaining largely transparent to other wavelengths. In this way, the imaging array can more efficiently use the incoming signal. In addition, smaller pixels can be used, facilitating collecting both higher frequency spatial information and collecting a larger variety of wavelength information. With such smaller pixels, the Mie photo sensors' semiconductor junction area can be vastly reduced, decreasing the junction saturation current and, in turn, reducing the sensors' minimum sensitivity. Increased efficiency can result in lower noise, lower intensity thresholds, or smaller array areas. Stacked photo sensors can also enable utilization of chromic aberrations that occur in imaging systems. Chromic aberration results in different colors from the object plane coming to a focus in different image planes. Such an arrangement allows for less expensive and complex optics or, alternatively, higher resolution images. By designing optics with engineered chromic aberration, color images without any color filtering becomes possible.

III.E Performance Improvement from Mie Photo Sensors

Mie photo sensors overcome constraints currently seen with conventional photo sensors in at least three areas: 1) image quality, 2) three-dimensional pixel size, and 3) functionality.

Mie photo sensors have a significant impact on image quality because they can improve measurement sensitivity, dynamic range, and response time relative to traditional photo sensors. Under a variety of implementation configurations, they can be used to further reduce noise, to enhance spatial resolution and to improve image contrast. Furthermore, they eliminate critical challenges that arise in the use of small pixels in applications which require long integration times arising from low illumination.

Mie photo sensors solve the challenges to substantially reducing the three-dimensional size of the pixel. Mie photo sensors are fabricated at sizes transverse to the incident light on the order of, or smaller than, the wavelength of light to be detected. Equally important, Mie photo sensors are able to be implemented with a thickness less than $1/\alpha$. In conjunction with current semiconductor planarization techniques, arrays of such thinner photo sensors deliver a smaller depth of focus which in turn eases utilizing such small pixels.

Mie photo sensors also improve functionality in a number of critical ways. First, Mie photo sensor has a significant impact SWaP. Smaller and thinner arrays can translate into utilization of smaller f-number optics for some applications. Smaller f-number optics can be significantly more compact. Mie photo sensors reduce power consumption of each pixel so as to reduce the overall power requirements of the imaging device or, alternatively, to enable an increase in pixel count while minimizing the increase in power consumption.

Additionally, Mie photo sensors exhibiting different resonances in wavelength or polarization mean that different sensors can have an intrinsic sensitivity to light of different types. Using conventional photo sensors, wavelength or polarization specificity is achieved using filtering. This approach removes the incident, information bearing, light except that of a specified type. Rather than eliminating the other light, Mie sensors can be thought of as extracting the specified light from the incoming stream and allowing either nearby, adjacent, or trailing Mie photo sensors to continue to measure other aspects of the light. Mie photo sensors exhibiting a resonance to one or more features of incident light are therefore referred to as selecting Mie photo sensors.

As such, it becomes possible to develop compact, low power devices using Mie photo sensors for image detection and chip level integration of multiple, high resolution, imaging modalities for rapid data collection of fast-moving scenes.

Further, Mie photo sensors can reduce many of the fill factor issues seen with conventional sensor technologies where the percentage of light sensitive area in a pixel directly impacts the sensitivity of a sensor and the signal-to noise of the captured image. As such, there is greater opportunity to embed computer vision pre-processing functions on the chip while limiting expansion of sensor size and power consumption.

III.F Applications

The small size, high speed, and compatibility with silicon fabrication technology suggests that Mie photo sensors could be implemented, as single detectors or arrays of detectors, as the receiver for optically transmitted signals. In particular, Mie photo sensors could be fabricated as part of individual integrated circuits making up computer components thereby simplifying the increase in information transfer rates within components, between components on the CPU board and on computer backplanes.

The advantages of imaging with optics or contact imaging with a Mie photo sensor array include increased spatial resolution, increased contrast, smaller camera packages, spectral sensitivity, polarization-based imaging, imaging with lower power input requirements, etc. These advantages deliver enhanced performance in many applications including imaging for consumer electronics, medical imaging for endoscopy and surgical robotics, industrial imaging and machine vision, imaging for automotive applications including self-driving cars, and imaging for security and defense applications.

The high speed of the Mie photo sensor suggests it has particular value for optical time-of-flight measurements. Individual Mie photo sensors could be implemented as part of object tracking and crash prediction. Implemented as arrays, Mie photo sensors could be utilized in this way as a means of three-dimensional scene reconstruction.

The low light sensitivity in combination with the logarithmic response of Mie photo sensors implemented in the open-circuit mode suggests utility for imaging in near dark to bright light conditions. Such a range is frequently found in automotive cameras, surveillance imaging tools, and many industrial applications.

What is claimed is:

1. A Mie photo sensor comprising:
   a material layer having an index of refraction and comprising a mesa of semiconducting material, the mesa configured to generate free carriers within the semiconducting material in response to an electromagnetic perturbation;
   a refractive medium surrounding the material layer and having a complex index of refraction, the refractive medium and mesa forming (i) an interface with a discontinuous index of refraction, and (ii) an electromagnetic scattering center configured for generating free carriers via optical absorption and Mie resonance of the electromagnetic perturbation at the electromagnetic scattering center; and
   one or more electrical contacts electrically coupled to the electromagnetic scattering center and configured to sense free carriers generated within the electromagnetic scattering center in response to the electromagnetic perturbation,
   wherein the mesa of semiconducting material comprises at least one of doped silicon, gallium arsenide, gallium phosphide, gallium nitride, cadmium telluride, or cadmium sulfide.

2. The Mie photo sensor of claim 1, wherein the mesa of semiconducting material forms a geometric shape having a set of boundaries, and the electromagnetic scattering center is formed at the set of boundaries such that the electromagnetic scattering center comprises the semiconducting material of the mesa.

3. The Mie photo sensor of claim 1, wherein the mesa of semiconducting material forms a geometric shape having a set of boundaries, and the electromagnetic scattering center is formed within boundaries such that the electromagnetic scattering center comprises some portion of the semiconducting material of the mesa.

4. The Mie photo sensor of claim 1, wherein the electromagnetic scattering center is configured to absorb a particular wavelength of electromagnetic perturbation, and a size of the electromagnetic scattering center is proportional to the particular wavelength of electromagnetic perturbation.

5. The Mie photo sensor of claim 4, wherein the proportionality between the size of the electromagnetic scattering center and the particular wavelength of electromagnetic perturbation is based on any of: the size of the electromagnetic scattering center, the particular wavelength of electromagnetic perturbation, the complex index of refraction, and the discontinuous index of refraction.

6. The Mie photo sensor of claim 1, wherein the electromagnetic scattering center is configured to absorb a particular polarization of electromagnetic perturbation, and a size of the electromagnetic scattering center is proportional to the particular polarization of electromagnetic perturbation.

7. The Mie photo sensor of claim 6, wherein the proportionality between the size of the electromagnetic scattering center and the particular polarization of electromagnetic perturbation is based on any of: the size of the electromagnetic scattering center, the particular polarization of electromagnetic perturbation, the complex index of refraction, and the discontinuous index of refraction.

8. The Mie photo sensor of claim 1, wherein:
   the electromagnetic scattering center absorbs a particular wavelength of electromagnetic perturbation at a resonance level and generates a first amount of free carriers corresponding the resonance level,
   the electromagnetic scattering center absorbs a different wavelength of electromagnetic perturbation at a non-resonance level and generates a second amount of free carriers corresponding to the non-resonance level, and
   the first amount of free electrons is greater than the second amount of free electrons.

9. The Mie photo sensor of claim 1, wherein the optical absorption per unit volume of the electromagnetic perturbation in the electromagnetic scattering center is higher than the optical absorption per unit volume of the electromagnetic perturbation in both the material layer and the refractive medium.

10. The Mie photo sensor of claim 1, wherein:
    a first amount of free carriers per unit volume generated by absorption of the electromagnetic perturbation in the electromagnetic scattering center,
    a second amount of carriers per unit volume are generated by the electromagnetic perturbation in the material layer, and
    the first amount of free carriers per unit volume is greater than the second amount of free carriers per unit volume.

11. The Mie photo sensor of claim 1, wherein the material layer comprises at least one of silicon, silicon dioxide, semiconductor material, carbon, gallium arsenide, mercury cadmium telluride, platinum silicide, germanium, or thallium bromide.

12. The Mie photo sensor of claim 1, wherein the refractive medium comprises any one of silicon dioxide, air, oil, or water.

13. The Mie photo sensor of claim 1, wherein the mesa of semiconducting material has a height between 50 nm and 250 nm, the height measured in a perpendicular direction relative to a surface of the material layer.

14. The Mie photo sensor of claim 1, wherein the mesa of semiconducting material has a feature size between 10 nm and 80 nm in a first direction and a feature size between 10 nm and 80 nm in a second direction, the first direction and second direction orthogonal to one another and parallel to a surface of the material layer.

15. The Mie photo sensor of claim 1, wherein:
the mesa of semiconducting material has an additional index of refraction, and
a real portion of the complex index of refraction is less than the discontinuous index of refraction and the additional index of refraction.

16. The Mie photo sensor of claim 15, wherein a real portion of the additional index of refraction is the same as the discontinuous index of refraction.

17. The Mie photo sensor of claim 1, wherein the one or more electrical contacts comprise at least a first electrical contact and a second electrical contact, the first electrical contact having a first type different than a second type of the second electrical contact.

18. The Mie photo sensor of claim 1, wherein the one or more electrical contacts comprise one or more of an Ohmic contact, a Schottky barrier, or a p-n junction.

19. A Mie photo sensor array comprising:
a plurality of electrically coupled Mie photo sensors configured to generate free carriers in response to a plurality of electromagnetic perturbations, each Mie photo sensor of the plurality of electrically coupled Mie photo sensors comprising:
a material layer having an index of refraction and comprising a mesa of semiconducting material having feature sizes of a plurality of feature sizes,
a refractive medium surrounding the material layer and having a complex index of refraction different from the index of refraction, the refractive medium and mesa forming (i) an interface with a discontinuous index of refraction, and (ii) an electromagnetic scattering center configured to generate free carriers via optical absorption and Mie resonance for an electromagnetic perturbation of the plurality of electromagnetic perturbations, and
one or more electrical contacts electrically coupled to the electromagnetic scattering center and configured to sense free carriers generated within the electromagnetic scattering center in response to the electromagnetic perturbation;
wherein the mesa of semiconducting material comprises at least one of doped silicon, gallium arsenide, gallium phosphide, gallium nitride, cadmium telluride, or cadmium sulfide; and
wherein, for each Mie photo sensor in the plurality of electrically coupled Mie photo sensors, feature sizes of each Mie photo sensor select a wavelength of the electromagnetic perturbation of the plurality of electromagnetic perturbations that generate free carriers via optical absorption and Mie resonance in each Mie photo sensor.

* * * * *